United States Patent
Sanghoon

(10) Patent No.: US 11,716,845 B2
(45) Date of Patent: Aug. 1, 2023

(54) SEMICONDUCTOR DEVICES INCLUDING CHANNEL PATTERN AND METHOD FOR MANUFACTURING THE SAME

(71) Applicant: Samsung Electronics Co., Ltd., Suwon-si (KR)

(72) Inventor: Lee Sanghoon, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 264 days.

(21) Appl. No.: 17/078,593

(22) Filed: Oct. 23, 2020

(65) Prior Publication Data

US 2021/0335810 A1 Oct. 28, 2021

(30) Foreign Application Priority Data

Apr. 28, 2020 (KR) .......................... 10-2020-0051528

(51) Int. Cl.
*H01L 27/11582* (2017.01)
*H10B 43/27* (2023.01)
*G11C 7/18* (2006.01)
*H10B 43/10* (2023.01)

(52) U.S. Cl.
CPC .............. *H10B 43/27* (2023.02); *G11C 7/18* (2013.01); *H10B 43/10* (2023.02)

(58) Field of Classification Search
CPC .......................... H01L 27/11582; H10B 43/27
See application file for complete search history.

(56) References Cited

U.S. PATENT DOCUMENTS

| | | | |
|---|---|---|---|
| 9,142,304 B2 | 9/2015 | Costa et al. | |
| 10,431,595 B1 | 10/2019 | Yang et al. | |
| 10,522,560 B2 | 12/2019 | Lee | |
| 2018/0358365 A1 | 12/2018 | Lee | |
| 2019/0157294 A1 | 5/2019 | Kanamori et al. | |
| 2019/0333922 A1* | 10/2019 | Jung | H01L 27/11565 |
| 2019/0355741 A1* | 11/2019 | Lee | H01L 21/76877 |
| 2019/0393238 A1 | 12/2019 | Lim et al. | |
| 2020/0020713 A1 | 1/2020 | Choi et al. | |

* cited by examiner

*Primary Examiner* — Christopher A Johnson
(74) *Attorney, Agent, or Firm* — Myers Bigel, P.A.

(57) ABSTRACT

A semiconductor device includes a gate structure on a substrate, the gate structure including insulating layers and gate electrodes, which are alternately stacked, a channel structure extending through the gate structure, and a source conductive pattern between the substrate and the gate structure. The source conductive pattern includes a lower source conductive pattern and an upper source conductive pattern on the lower source conductive pattern. The channel structure includes an insulating pattern extending through the source conductive pattern, a data storage pattern, and a channel pattern between the insulating pattern and the data storage pattern. A lower surface of the channel pattern is at a level higher than an upper surface of the upper source conductive pattern, but lower than a lower surface of a lowermost one of the gate electrodes in a cross-sectional view of the semiconductor device with the substrate providing a base reference level.

20 Claims, 23 Drawing Sheets

SEMICONDUCTOR DEVICES INCLUDING CHANNEL PATTERN AND METHOD FOR MANUFACTURING THE SAME

CROSS-REFERENCE TO THE RELATED APPLICATION

This application claims priority from Korean Patent Application No. 10-2020-0051528, filed on Apr. 28, 2020, in the Korean Intellectual Property Office, the disclosure of which is incorporated herein by reference in its entirety.

BACKGROUND

1. Field

The example embodiments of the disclosure relate to a semiconductor device including a channel pattern and a method for manufacturing the same.

2. Description of the Related Art

Data erase of a vertical NAND flash memory may be carried out through a gate-induced drain leakage (GIDL) operation in which holes are created using GIDL.

When a GIDL operation is carried out in a vertical NAND flash memory, it may be necessary to diffuse an impurity around a channel region of an erase control transistor for creation of holes. To this end, a method for diffusing an impurity included in a source conductive pattern disposed between a substrate and a gate electrode through a thermal treatment process may be applied to such a vertical NAND flash memory.

Such a channel pattern may include polysilicon. In connection with this, because polysilicon has a crystalline structure, the diffusion rate of an impurity in the channel pattern may be varied in accordance with an arrangement state of crystals of the channel pattern. That is, diffusion may be successfully carried out in a portion of the channel pattern, and may be less successfully carried out in another portion of the channel pattern. As a result, diffusion may be excessively carried out in a portion of an area around the channel region of the erase control transistor and, as such, the concentration of the impurity may be excessively high in this portion, whereas diffusion may be insufficiently carried out in another portion of the area and, as such, the concentration of the impurity may be lower than a required degree in this other portion. As a result, the reliability of a GIDL erase operation may be degraded.

SUMMARY

The example embodiments of the inventive concept may physically improve the diffusion distance of an N-type impurity required for gate-induced drain leakage (GIDL) operation in a vertical NAND flash memory device. In addition, the example embodiments of the inventive concept may provide a method capable of appropriately controlling a diffusion degree of the N-type impurity even after a desired physical distance of the N-type impurity is secured.

A semiconductor device according to an embodiment of the inventive concept includes a gate structure on a substrate, the gate structure including insulating layers and gate electrodes, which are alternately stacked, a channel structure extending through the gate structure, and a source conductive pattern disposed between the substrate and the gate structure, wherein the source conductive pattern includes a lower source conductive pattern and an upper source conductive pattern on the lower source conductive pattern, wherein the channel structure includes an insulating pattern extending through the source conductive pattern, a data storage pattern, and a channel pattern disposed between the insulating pattern and the data storage pattern, and wherein a lower surface of the channel pattern is disposed at a level higher than an upper surface of the upper source conductive pattern, but lower than a lower surface of a lowermost one of the gate electrodes in a cross-sectional view of the semiconductor device with the substrate providing a base reference level.

A semiconductor device according to another embodiment of the inventive concept includes a gate structure on a substrate, the gate structure including insulating layers and gate electrodes, which are alternately stacked, a channel structure extending through the gate structure, and a source conductive pattern disposed between the substrate and the gate structure, wherein the source conductive pattern includes a lower source conductive pattern and an upper source conductive pattern on the lower source conductive pattern, wherein the channel structure includes an insulating pattern extending through the source conductive pattern, a data storage pattern, and a channel pattern disposed between the insulating pattern and the data storage pattern, wherein a portion of the lower source conductive pattern is disposed between the insulating pattern and the data storage pattern while physically contacting a lower surface of the channel pattern, and wherein the lower surface of the channel pattern is disposed at a higher level than a lower surface of the data storage pattern in a cross-sectional view of the semiconductor device with the substrate providing a base reference level.

A semiconductor device according to another embodiment of the inventive concept includes a gate structure disposed on a substrate, the gate structure including insulating layers and gate electrodes, which are alternately stacked, a lower source conductive pattern disposed between the substrate and the gate structure, an upper source conductive pattern disposed between the lower source conductive pattern and the gate structure, a channel structure extending through the gate structure, a common source structure extending through the channel structure, a contact disposed on the channel structure, and a bit line disposed on the contact, wherein the channel structure includes an insulating pattern extending through the upper surface conductive pattern and the lower source conductive pattern, a data storage pattern, and a channel pattern disposed between the insulating pattern and the data storage pattern, wherein the data storage pattern includes a tunnel insulating layer, a charge storage layer and a blocking layer which are sequentially stacked on the channel pattern, wherein the lower source conductive pattern includes a horizontal extension on an upper surface of the substrate, a vertical extension extending between the insulating pattern and the upper source conductive pattern, and a protrusion protruding from an upper surface of the vertical extension, and wherein the protrusion includes a first protrusion disposed between the insulating pattern and the tunnel insulating layer while physically contacting a lower surface of the channel pattern.

DETAILED DESCRIPTION OF EXAMPLE EMBODIMENTS

Figure 1:
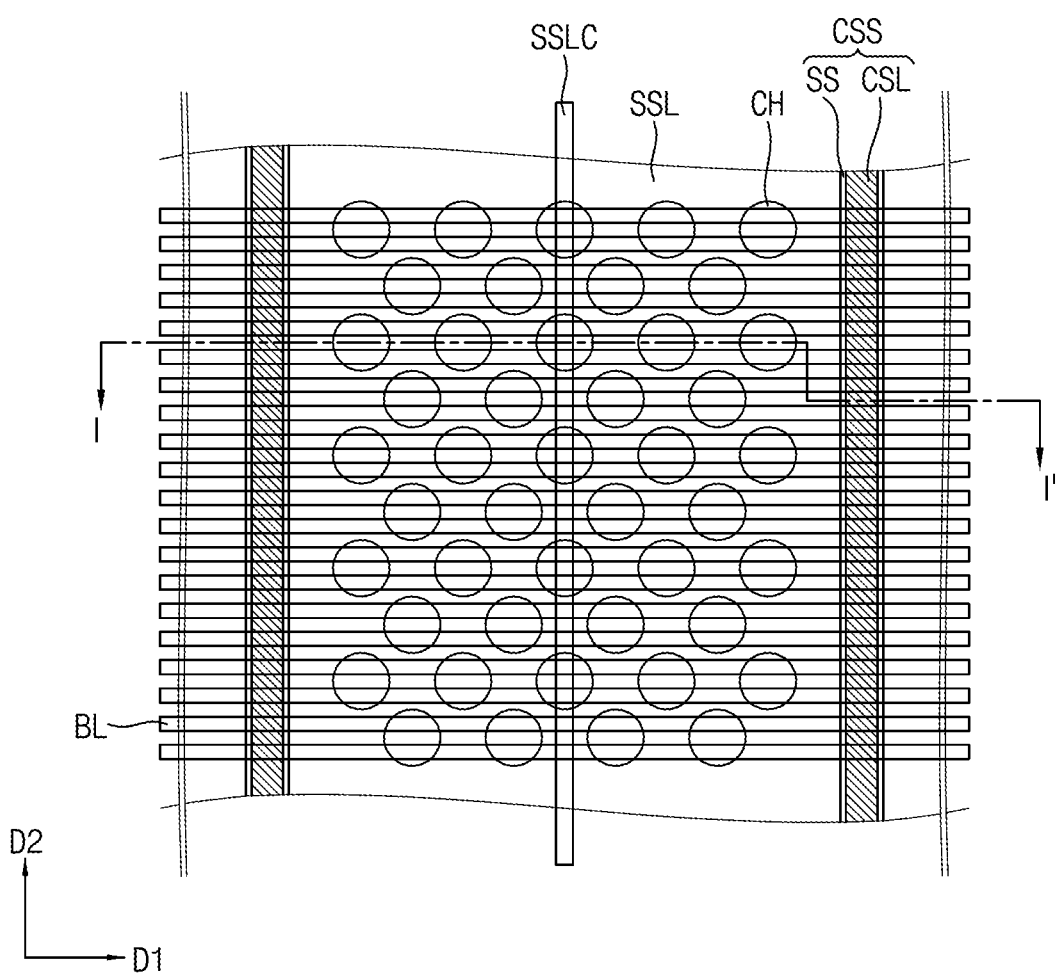
FIG. 1 is a schematic layout of a cell area in a semiconductor device according to an example embodiment of the inventive concept.

Hereinafter, embodiments of the inventive concepts will be described in detail with reference to the accompanying drawings. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination FIG. 1 is a schematic layout of a cell area in a semiconductor device according to an example embodiment of the inventive concept.

Referring to FIG. 1, the semiconductor device according to the illustrated embodiment of the inventive concept may include channel structures CH, common source structures CSS, string selection lines SSL, a string selection line separation pattern SSLC, and bit lines BL, which are configured as shown.

The channel structures CH may have a circular shape. The channel structures CH are arranged in a first direction D1 and, as such, pad rows may be formed. Accordingly, a plurality of pad rows may be arranged in parallel in a second direction D2. The channel structures CH may be arranged in the form of a dense hexahedral lattice or in a zig-zag manner.

The common source structures CSS may extend in the second direction D2 while being disposed in parallel in a state in which the channel structures CH are disposed between the common source structures CSS. Each common source structure CSS may include a common source line CSL and a spacer SS. The spacer SS may be disposed at opposite side surfaces of the common source line CSL.

The string selection lines SSL may be disposed between the common source structures CSS. The string selection lines SSL may be separated from each other by the common source structures CSS. In addition, the string selection lines SSL may be separated from each other by the string selection line separation pattern SSLC.

The string selection line separation pattern SSLC may extend in the second direction D2, and may separate each string selection line SSL into a pair of string selection lines spaced apart from each other in the first direction D1.

The bit lines BL may extend in the first direction D1 while being disposed in parallel. The bit lines BL may be disposed to vertically overlap with the channel structures CH. For example, one channel structure CH may overlap with two bit lines BL.

Figure 2:
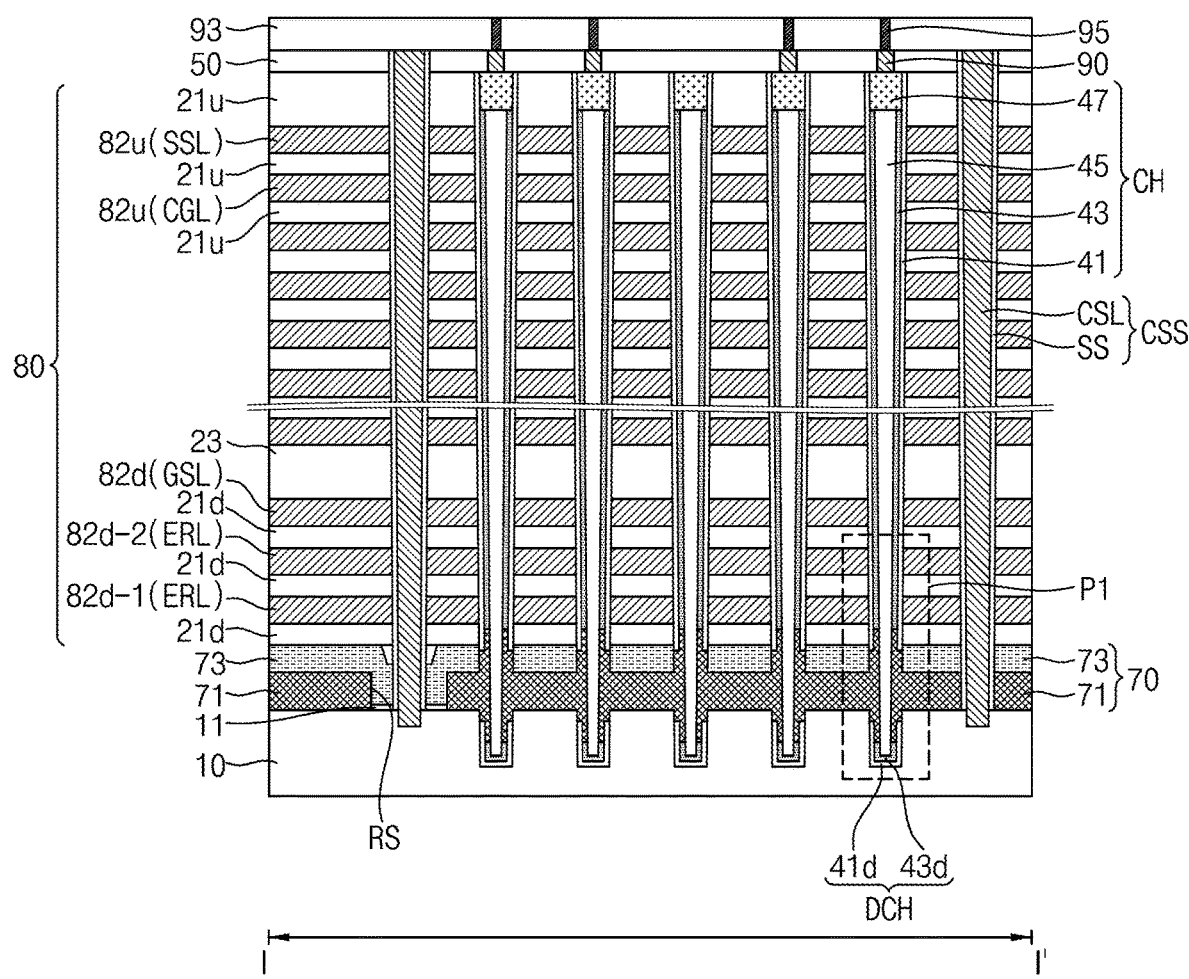
FIG. 2 is a cross-sectional view taken along line I-I' in FIG. 1.
Figure 3:
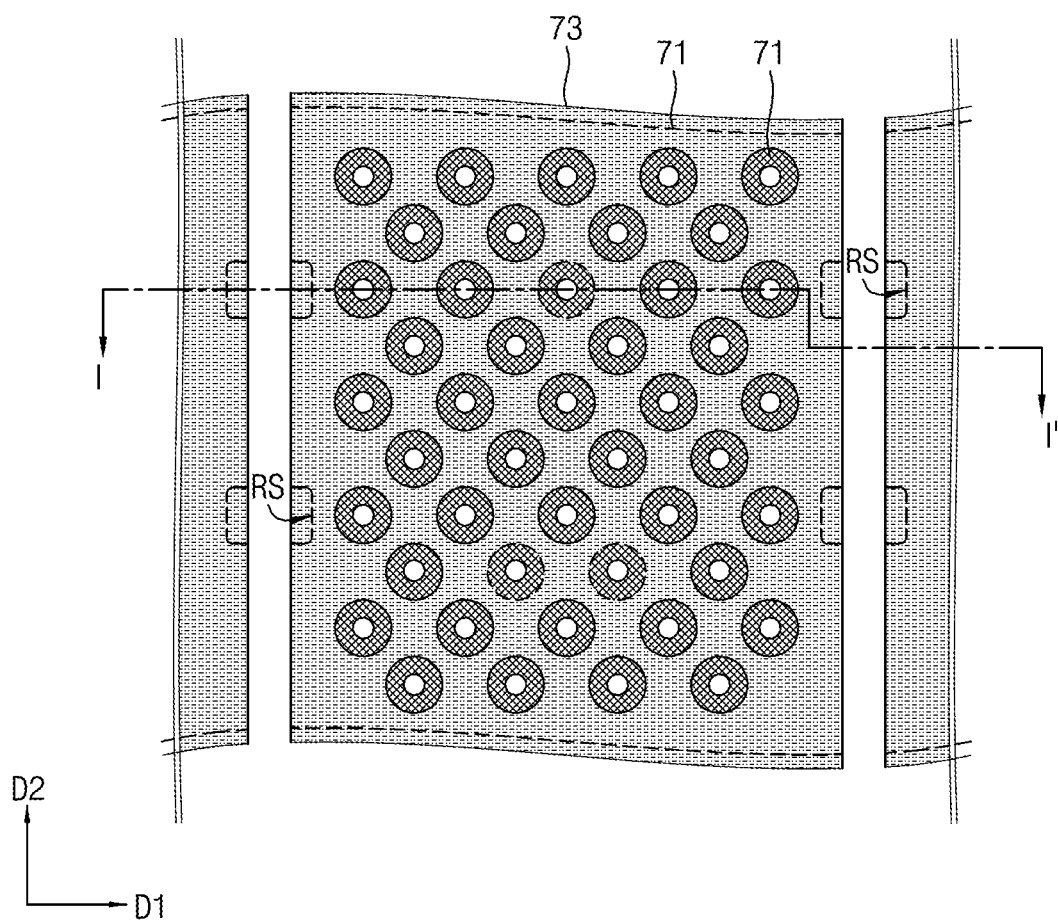
FIG. 3 is a planar layout of a source conductive pattern shown in FIG. 2.

FIG. 2 is a cross-sectional view taken along line I-I' in FIG. 1. FIG. 3 is a planar layout of a source conductive pattern shown in FIG. 2.

Referring to FIG. 2, the semiconductor device according to the illustrated embodiment of the disclosure may include a substrate 10, an insulating film 11, a source conductive pattern 70, a gate structure 80, a channel structure CH, a dummy channel structure DCH, a capping layer 50, a common source structure CSS, a buffer pattern BF, a lower contact 90, an interlayer insulating layer 93, and an upper contact 95, which are configured as shown.

The substrate 10 may be a semiconductor substrate. For example, the substrate 10 may be a silicon substrate, a germanium substrate, or a silicon-germanium substrate.

The source conductive pattern 70 may be disposed on the substrate 10. The source conductive pattern 70 may include a lower source conductive pattern 71 and an upper source conductive pattern 73.

Referring to FIGS. 2 and 3, the lower source conductive pattern 71 may be on and at least partially cover an upper surface of the substrate 10. The lower source conductive pattern 71 may include recessed side surfaces RS. The recessed side surfaces RS may have a concave shape that extends inwards towards the lower source conductive pattern 71. The insulating film 11 may be provided at an upper surface of the substrate 10 exposed between the recessed side surfaces RS.

The upper source conductive pattern 73 may be disposed on the lower source conductive pattern 71. The upper source conductive pattern 73 may be on and at least partially cover upper and side surfaces of the lower source conductive pattern 71. A portion of the lower source conductive pattern 71 may extend into a hole formed at the upper source conductive pattern 73. The upper source conductive pattern 73 may be on and at least partially cover the insulating film 11. In an embodiment, when the insulating film 11 is omitted, the upper source conductive pattern 73 may be directly on and at least partially cover the upper surface of the substrate 10 exposed between the recessed side surfaces RS.

Each of the upper source conductive pattern 73 and the lower source conductive pattern 71 may include a semiconductor material doped with an impurity. For example, each of the upper source conductive pattern 73 and the lower source conductive pattern 71 may include a semiconductor material doped with an N-type impurity. The upper source conductive pattern 73 and the lower source conductive pattern 71 may have different impurity concentrations. For example, the lower source conductive pattern 71 may have a greater N-type impurity concentration than the upper source conductive pattern 73.

Again referring to FIG. 2, the gate structure 80 may be disposed on the source conductive pattern 70. The gate structure 80 may include insulating layers 21$d$ and 21$u$ and gate electrodes 82$d$, 82$d$-1, 82$d$-2 and 82$u$, which are alternately repeatedly stacked.

The gate electrodes 82$d$, 82$d$-1, 82$d$-2 and 82$u$ may include lower gate electrodes 82$d$, 82$d$-1 and 82$d$-2, and upper gate electrodes 82$u$. The insulating layers 21$d$ and 21$u$ may include a planarization layer 23 disposed between the lower gate electrodes 82$d$, 82$d$-1 and 82$d$-2 and the upper gate electrodes 82$u$.

The lower gate electrodes 82$d$, 82$d$-1 and 82$d$-2 may include an erase control gate electrode ERL and a ground selection gate electrode GSL. The erase control gate electrode ERL may be a lowermost one of the lower gate electrodes 82$d$, 82$d$-1 and 82$d$-2, that is, the gate electrode 82$d$-1. In an embodiment, the lower gate electrodes 82$d$, 82$d$-1 and 82$d$-2 may include a double-layer erase control gate electrode ERL including the gate electrodes 82$d$-1 and 82$d$-2. That is, the gate electrode 82$d$-2 disposed vertically nearest to the lowermost gate electrode 82$d$-1 among the lower gate electrodes 82$d$, 82$d$-1 and 82$d$-2 may also be an erase control gate electrode ERL. The ground selection gate electrode GSL may be disposed on the erase control gate electrode ERL. The ground selection gate electrode GSL may be an uppermost one of the lower gate electrodes 82$d$, 82$d$-1 and 82$d$-2, that is, the gate electrode 82$d$. The erase control gate electrode ERL may be used as gate electrodes of erase control transistors to control an erase operation of a memory cell array in the semiconductor device. The ground selection gate electrode GSL may be used as a gate electrode of a ground selection transistor of the memory cell array in the semiconductor device.

The planarization layer 23 may be interposed between the uppermost gate electrode 82$d$ among the lower gate electrodes 82$d$, 82$d$-1 and 82$d$-2 and a lowermost one of the upper gate electrodes 82$u$. The planarization layer 23 may have a different thickness from the lower insulating layers 21$d$ each disposed between vertically neighboring (in the cross-sectional view of FIG. 2) ones of the lower gate electrodes 82$d$, 82$d$-1 and 82$d$-2 and/or the upper insulating layers 21$u$ each disposed between vertically neighboring (in the cross-sectional view of FIG. 2) ones of the upper gate electrodes 82$u$. For example, the planarization layer 23 may have a greater thickness than the lower insulating layers 21$d$ and the upper insulating layers 21$u$.

The upper gate electrodes 82$u$ may include a cell gate electrode CGL and a string selection gate electrode SSL. The cell gate electrode CGL may be disposed between the planarization layer 23 and the string selection gate electrode SSL. The string selection gate electrode SSL is disposed on the cell gate electrode CGL, and may be an uppermost one of the upper gate electrodes 82$u$.

For example, the lower gate electrodes 82$d$, 82$d$-1 and 82$d$-2 and the upper gate electrodes 82$u$ may include a metal, a doped semiconductor, a conductive metal nitride and/or a transition metal. The lower insulating layers 21$d$, the upper insulating layers 21$u$, and the planarization layer 23 may include silicon oxide and/or a low dielectric film.

The channel structure CH may vertically extend (in the cross-sectional view of FIG. 2) from the lower source conductive pattern 71 through the gate structure 80. The channel structure CH may include an insulating pattern 45, a channel pattern 43, a data storage pattern 41, and a conductive pad 47.

The data storage pattern 41 may be disposed outside the channel pattern 43. The data storage pattern 41 may be disposed between the channel pattern 43 and the gate structure 80. The channel pattern 43 may be disposed between the insulating pattern 45 and the data storage pattern 41. The insulating pattern 45 may be disposed inside the channel pattern 43. The insulating pattern 45 extends downwards beyond a lower surface of the channel pattern 43, such that the insulating pattern 45 extends through the lower source conductive pattern 71 and the upper source conductive pattern 73. The lower surface of the insulating pattern 45 may physical contact the dummy channel structure DCH.

Each of the channel pattern 43 and the data storage pattern 41 may have the shape of a hollow cylinder or a hollow pipe although embodiments of the inventive concept are not limited to such shapes. For example, the channel pattern 43 may include a semiconductor material, such as silicon, germanium or silicon germanium. Alternatively, the channel pattern 43 may be an intrinsic semiconductor undoped with an impurity or a semiconductor doped with an impurity. The channel pattern 43 may include a polycrystalline semiconductor material.

The dummy channel structure DCH may be disposed between the substrate 10 and the lower source conductive pattern 71. As the source conductive pattern 70 is disposed between the dummy channel structure DCH and the channel structure CH, the dummy channel structure DCH and the channel structure CH may be vertically spaced apart from each other in the cross-sectional view of FIG. 2. The dummy channel structure DCH and the channel structure CH may overlap with each other in a vertical direction as shown in the cross-sectional view of FIG. 2. The dummy channel structure DCH may include a dummy channel pattern 43$d$ and a dummy data storage pattern 41$d$.

The conductive pad 47 may be disposed on the insulating pattern 45 and the channel pattern 43. The conductive pad 47 may be disposed inside the data storage pattern 41. The data storage pattern 41 may be on and at least partially cover an outer side surface of the conductive pad 47. An upper surface of the conductive pad 47 and an upper surface of the data storage pattern 41 may be substantially co-planar. For example, the conductive pad 47 may include a semiconductor material doped with an impurity and/or a conductive material.

The capping layer 50 may be disposed on the gate structure 80, such that the capping layer 50 is on and at least partially covers the upper surface of the gate structure 80, the upper surface of the data storage pattern 41 and the upper surface of the conductive pad 47. The common source structure CSS may vertically extend through the gate structure 80 and the capping layer 50 as shown in the cross-sectional view of FIG. 2. The spacer SS may be disposed between the common source line CSL and the gate structure 80. A portion of the common source line CSL may extend into the substrate 10. The buffer pattern BF may border and at least partially surround a portion of an outer side surface of the spacer SS. The buffer pattern BF may be disposed within the upper surface conductive pattern 73. An upper surface of the buffer pattern BF may physically contact the lowermost one of the lower insulating layers 21*d*.

The interlayer insulating layer 93 may be disposed on the capping layer 50. For example, each of the capping layer 50 and the interlayer insulating layer 93 may include an insulating material, such as silicon oxide. The lower contact 90 may extend through the capping layer 50, such that the lower contact 90 is connected to the conductive pad 47. The upper contact 95 may extend through the interlayer insulating layer 93, such that the upper contact 95 is connected to the lower contact 90. Each of the lower contact 90 and the upper contact 95 may include a conductive material.

Figure 4A:
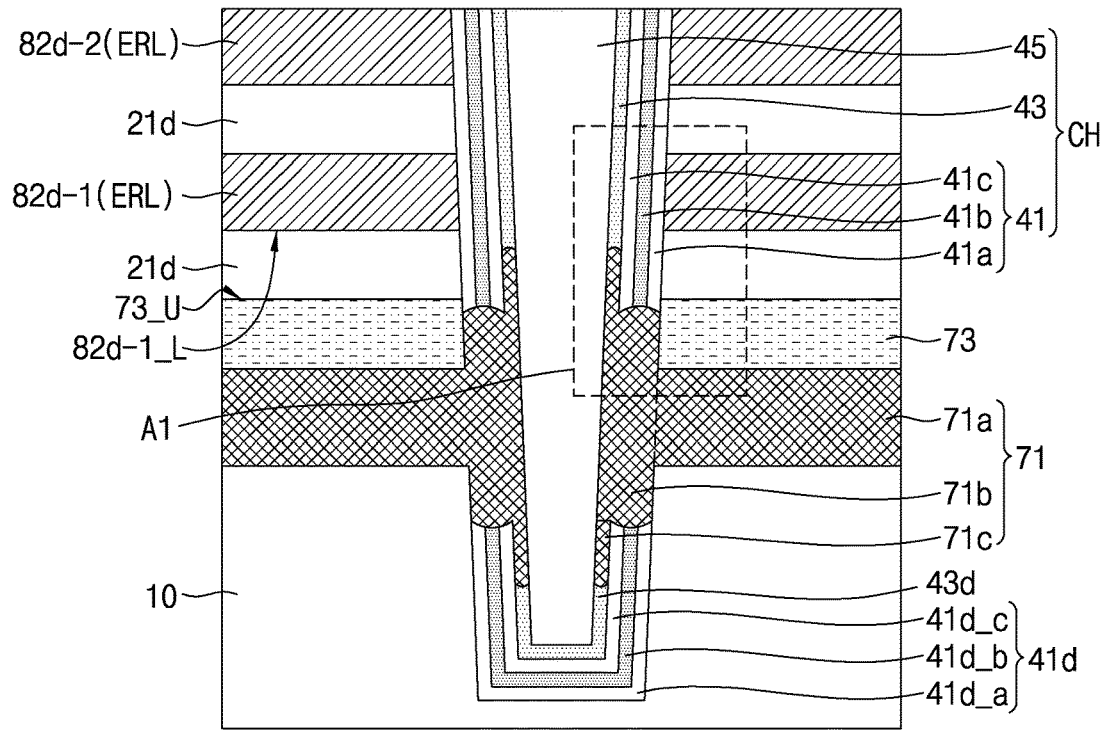
FIG. 4A is an enlarged view of an area P1 in FIG. 2 according to an embodiment of the inventive concept.
Figure 4B:
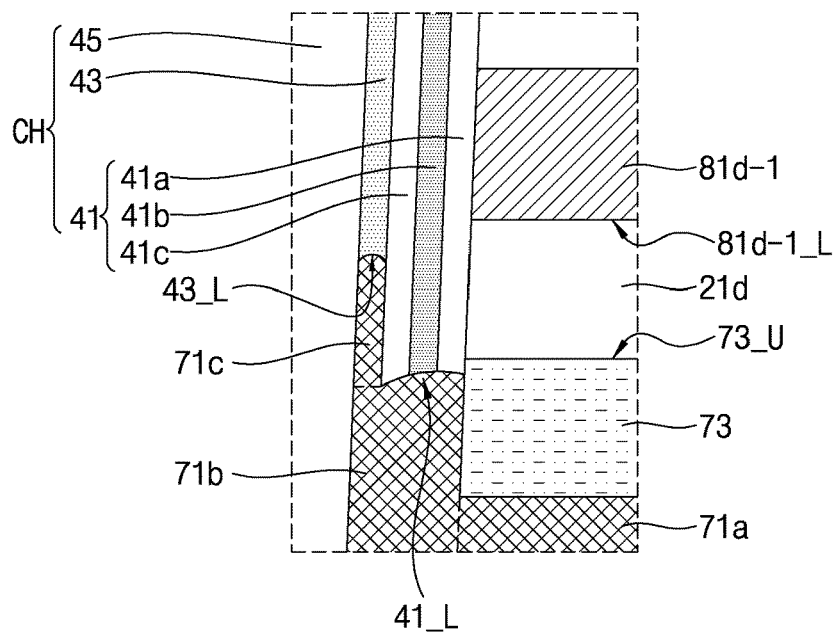
FIG. 4B is an enlarged view of an area A1 in FIG. 4A.
Figure 5A:
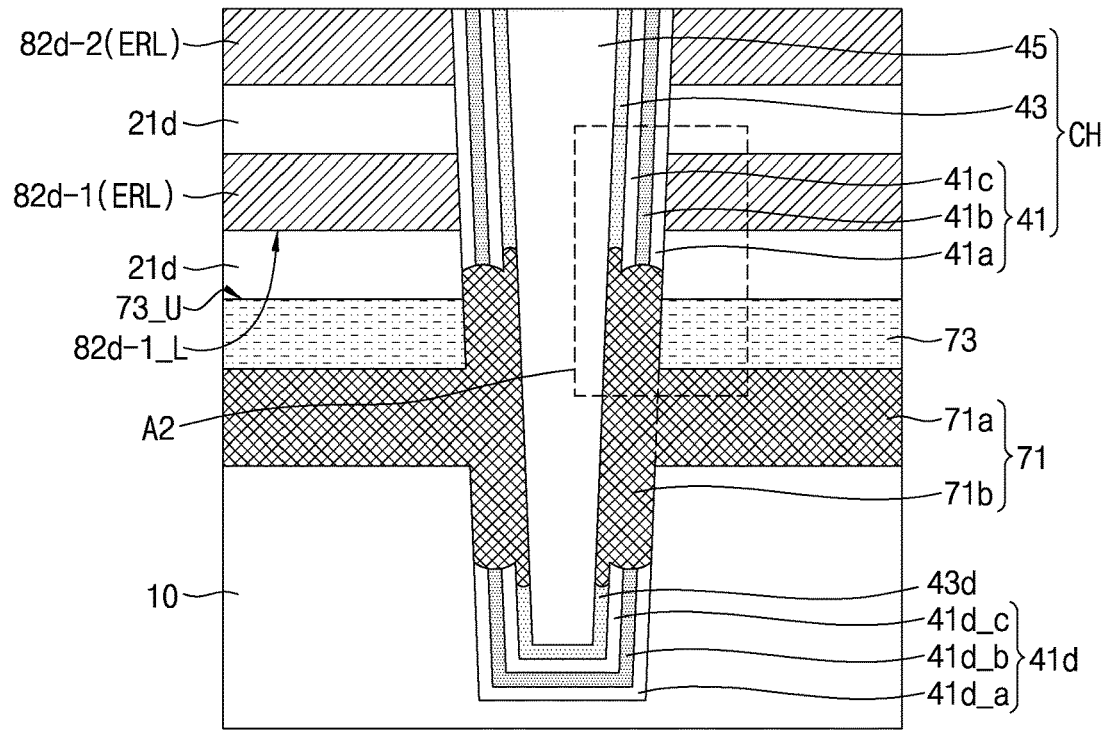
FIG. 5A is an enlarged view of the area P1 in FIG. 2 according to an embodiment of the inventive concept.
Figure 5B:
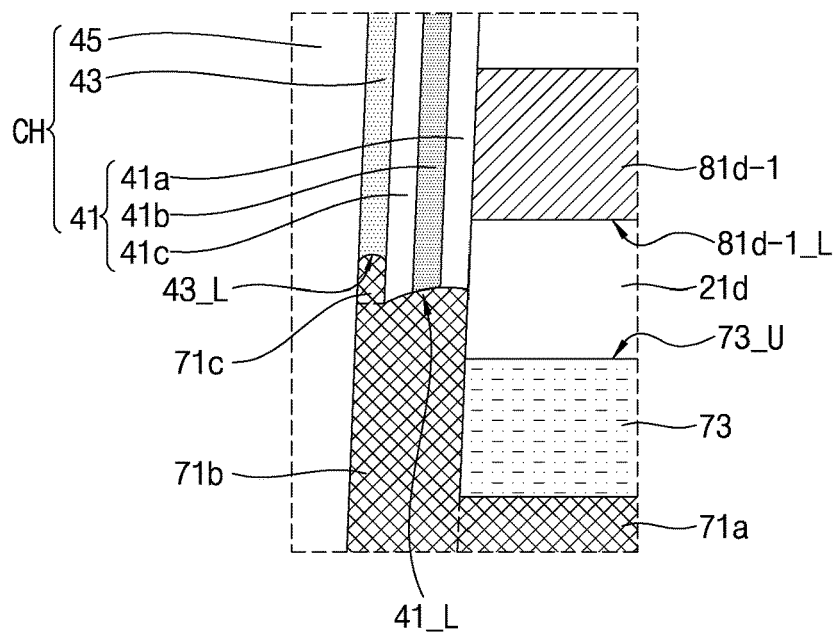
FIG. 5B is an enlarged view of an area A2 in FIG. 5A.

FIG. 4A is an enlarged view of an area P1 in FIG. 2 according to an embodiment of the inventive concept. FIG. 4B is an enlarged view of an area A1 in FIG. 4A. FIG. 5A is an enlarged view of the area P1 in FIG. 2 according to an embodiment of the inventive concept. FIG. 5B is an enlarged view of an area A2 in FIG. 5A.

Referring to FIGS. 4A to 5B, the data storage pattern 41 may include a blocking layer 41*a*, a charge storage layer 41*b*, and a tunnel insulating layer 41*c*. The dummy data storage pattern 41*d* may include a dummy blocking layer 41*d*_*a*, a dummy charge storage layer 41*d*_*b*, and a dummy tunnel insulating layer 41*d*_*c*. The charge storage layer 41*b* may include a trap insulating film, a floating gate electrode, and/or an insulating film including conductive nano dots. For example, the charge storage layer 41*b* may include a silicon nitride film, a silicon oxynitride film, a silicon-rich nitride, nanocrystalline silicon, and/or a laminated trap layer. The blocking layer 41*a* may include a material having a greater band gap than the charge storage layer 41*c*. For example, the blocking layer 41*a* may include a high dielectric film, such as an aluminum oxide film or a hafnium oxide film. The tunnel insulating layer 41*c* may include a material having a greater band gap than the charge storage layer 41*c*. For example, the tunnel insulating layer 41*c* may include a silicon oxide film. The dummy data storage pattern 41*d* may include the same material as the data storage pattern 41.

In an embodiment, a lower surface 43_L of the channel pattern 43 may be disposed at a higher level than a lower surface 41_L of the data storage pattern 41 as shown in the cross-sectional view of FIG. 4B. The lower surface 43_L of the channel pattern 43 may be disposed adjacent to a lower surface 82*d*-1_L of the lowermost gate electrode 82-1 at a lower level than the lower surface 82*d*-1_L of the lowermost gate electrode 82-1 as shown in the cross-sectional view of FIG. 4A.

Referring to FIGS. 4A and 4B, the lower source conductive pattern 71 may include a horizontal extension 71*a*, a vertical extension 71*b*, and a protrusion 71*c*. The horizontal extension 71*a* may be directly on and at least partially cover the upper surface of the substrate 10 while being interposed between the substrate 10 and the upper source conductive pattern 73. The vertical extension 71*b* extends upwards and downwards from the horizontal extension 71*a* in the cross-sectional views of FIGS. 4A and 4B and, as such, may have a shape having portions respectively protruding from upper and lower surfaces of the horizontal extension 71*a*. The vertical extension 71*b* may extend between the substrate 10 and the insulating pattern 45, and may extend between the upper source conductive pattern 73 and the insulating pattern 45. The vertical extension 71*b* may physically contact an outer side surface of the insulating pattern 45, and may border and at least partially surround a portion of the outer side surface of the insulating pattern 45.

In an embodiment, the protrusion 71*c* may have a shape protruding from the vertical extension 71*b*. The protrusion 71*c* may have a shape having portions respectively protruding upwards and downwards from upper and lower surfaces of the vertical extension 71*b*. The protrusion 71*c* may border and at least partially surround a portion of the outer side surface of the insulating pattern 45.

The protrusion 71*c* may extend upwards from the upper surface of the vertical extension 71*b*, and may be disposed between the data storage pattern 41 and the insulating pattern 45. An upper surface of the protrusion 71*c* may physically contact the lower surface 43_L of the channel pattern 43. The protrusion 71*c* may extend downwards from the lower surface of the vertical extension 71*b*, and may be disposed between the dummy data storage pattern 41*d* and the insulating pattern 45. A lower surface of the protrusion 71*c* may physically contact an upper surface of the dummy channel pattern 43*d*. An outer side surface of the protrusion 71*c* may physically contact an inner side surface of the tunnel insulating layer 41*c* or an inner side surface of the dummy tunnel insulating layer 41*c*.

In an embodiment, the upper surface of the protrusion 71*c* may be disposed at a level higher than an upper surface 73_U of the upper source conductive pattern 73, but lower than the lower surface 82*d*-1_L of the lowermost gate electrode 82-1 (that is, the lower surface of the lowermost erase control gate electrode ERL) as shown in the cross-sectional view of FIG. 4A. Accordingly, the lower surface 43_L of the channel pattern 43 physically contacting the upper surface of the protrusion 71*c* may also be disposed at a level higher than the upper surface 73_U of the upper source conductive pattern 73, but lower than the lower surface 82*d*-1_L of the lowermost gate electrode 82-1 as shown in the cross-sectional view of FIG. 4A. The upper surface of the vertical extension 71*b* physically contacting the lower surface 41_L of the data storage pattern 41 may be disposed at a level lower than the upper surface 73_U of the upper source conductive pattern 73 as shown in the cross-sectional view of FIG. 4B. Accordingly, the lower surface 41_L of the data storage pattern 41 may also be disposed at a level lower than the upper surface 73_U of the upper source conductive pattern 73 as shown in the cross-sectional view of FIG. 4B.

Referring to FIGS. 5A and 5B, in an embodiment, the upper surface of the vertical extension 71*b* physically contacting the lower surface 41_L of the data storage pattern 41 may be disposed at a level higher than the upper surface 73_U of the upper source conductive pattern 73. Accordingly, the lower surface 41_L of the data storage pattern 41 may also be disposed at a level higher than the upper surface 73_U of the upper source conductive pattern 73.

Figure 6A:
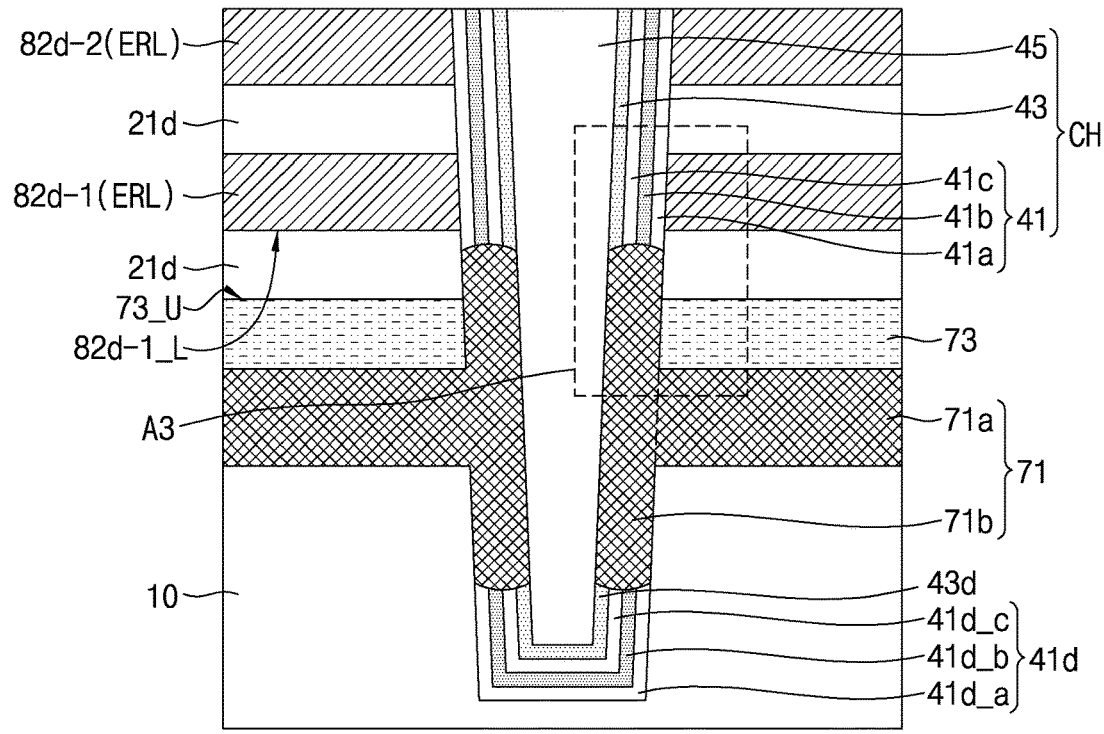
FIG. 6A is an enlarged view of the area P1 in FIG. 2 according to an embodiment of the inventive concept.
Figure 6B:
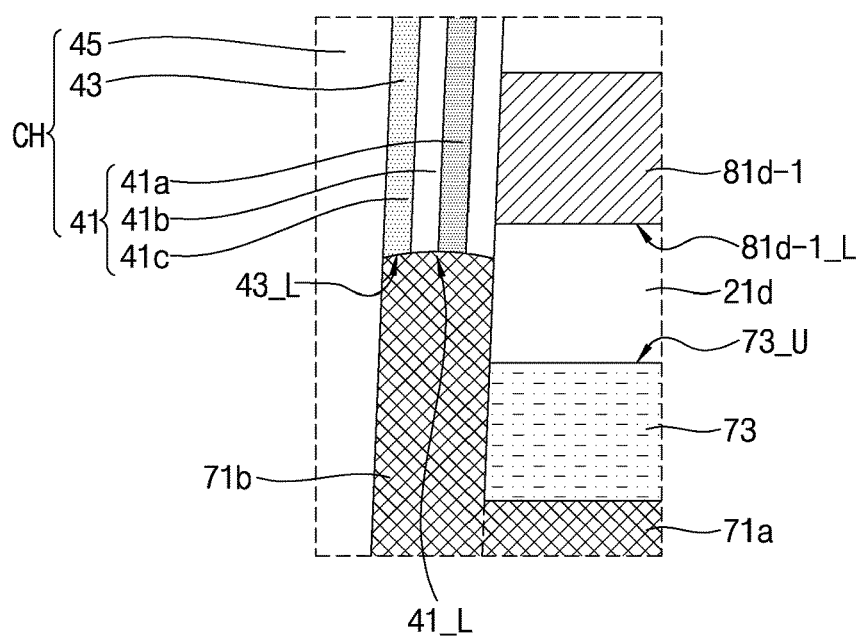
FIG. 6B is an enlarged view of an area A3 in FIG. 6A.

FIG. 6A is an enlarged view of the area P1 in FIG. 2 according to an embodiment of the inventive concept. FIG. 6B is an enlarged view of an area A3 in FIG. 6A.

Referring to FIGS. 6A and 6B, in an embodiment, the lower surface 43_L of the channel pattern 43 and the lower surface 41_L of the data storage pattern 41 may be disposed at substantially the same level between the upper surface 73_U of the upper source conductive pattern 73 and the lower surface 82*d*-1_L of the lowermost gate electrode 82*d*-1. That is, the lower surface 43_L of the channel pattern 43 and the lower surface 41_L of the data storage pattern 41 may be substantially co-planar. In an embodiment, the lower surface 43_L of the channel pattern 43 and the lower surface 41_L of the data storage pattern 41 may be disposed nearer to the lower surface 82d-1_L of the lowermost gate electrode 82d-1 than to the lower surface 73_L of the upper source conductive pattern 73. For example, the lower surface 43_L of the channel pattern 43 and the lower surface 41_L of the data storage pattern 41 may be disposed at substantially the same level as the lower surface 82d-1_L of the lowermost gate electrode 82d-1 in the cross-sectional views of FIGS. 6A and 6B.

Figure 7A:
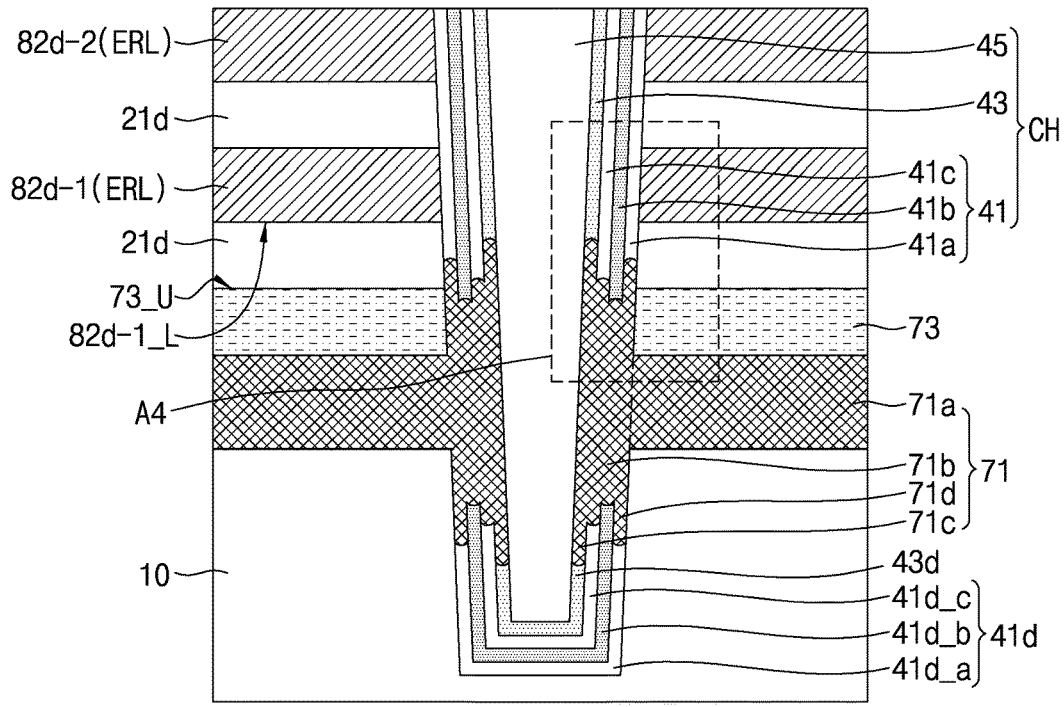
FIG. 7A is an enlarged view of the area P1 in FIG. 2 according to an embodiment of the inventive concept.
Figure 7B:
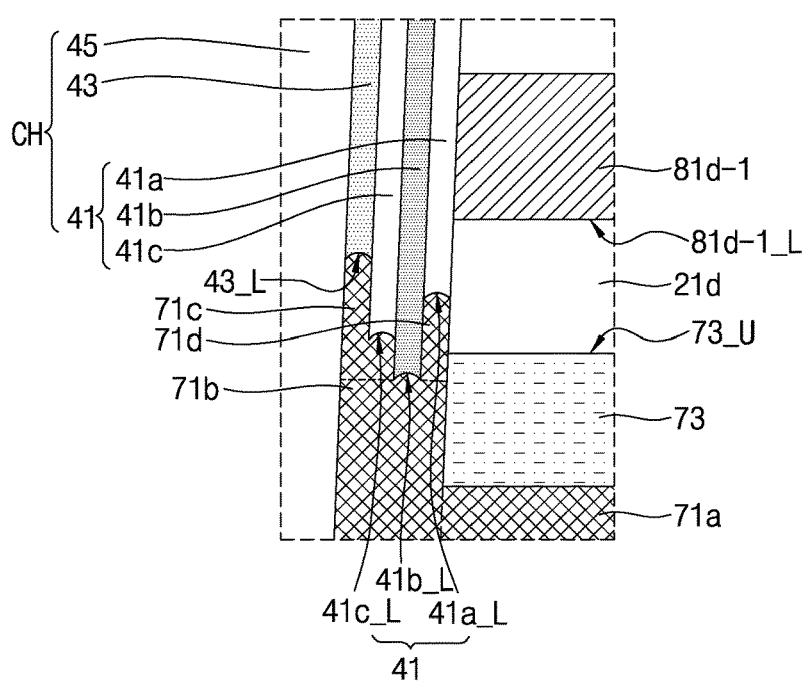
FIG. 7B is an enlarged view of an area A4 in FIG. 7A.
Figure 8A:
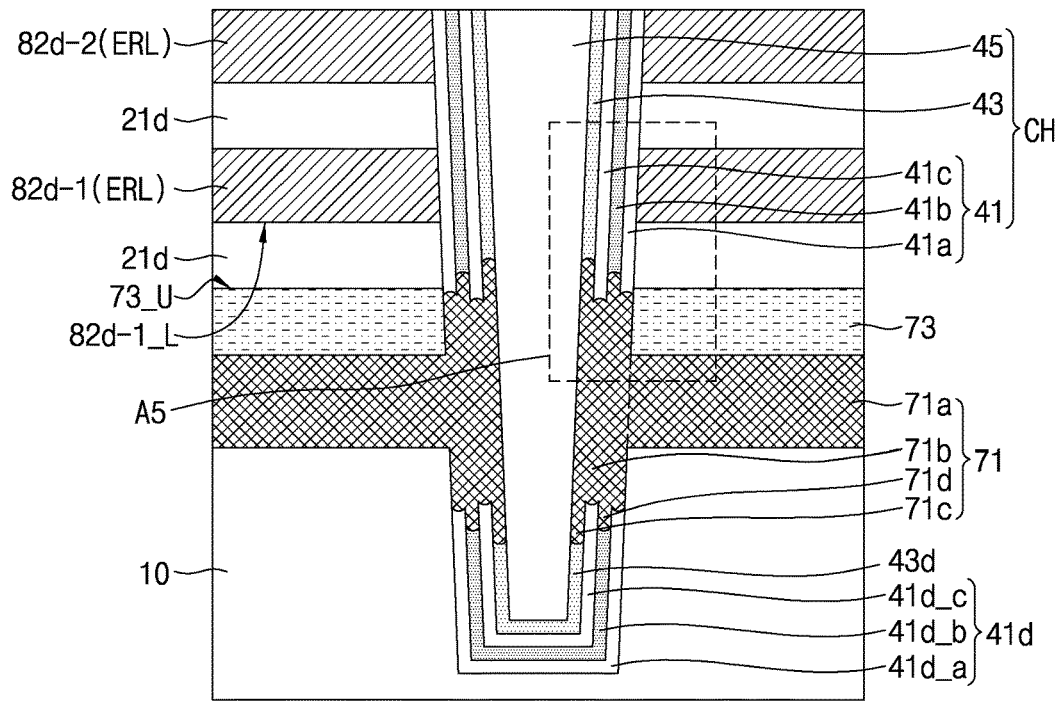
FIG. 8A is an enlarged view of the area P1 in FIG. 2 according to an embodiment of the inventive concept.
Figure 8B:
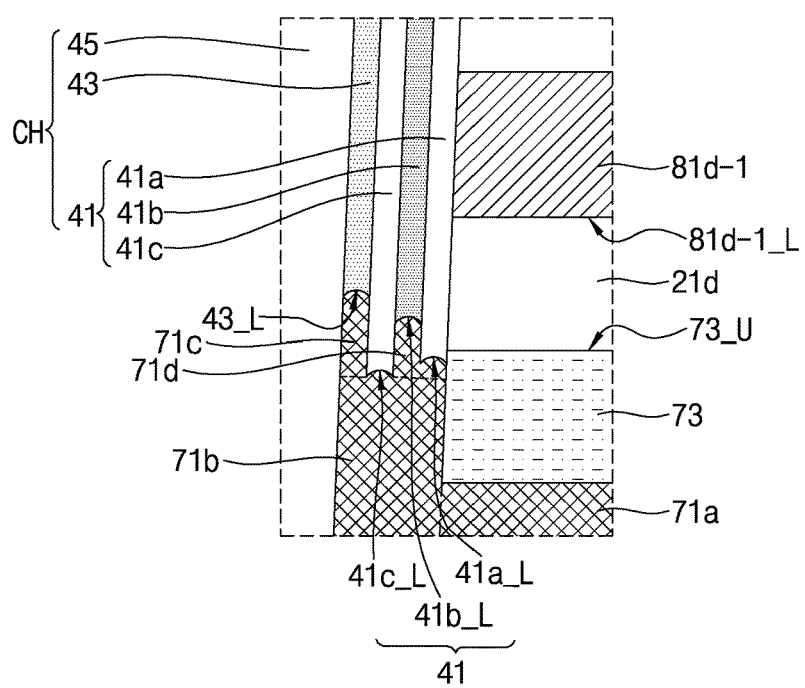
FIG. 8B is an enlarged view of an area A5 in FIG. 8A.
Figure 9A:
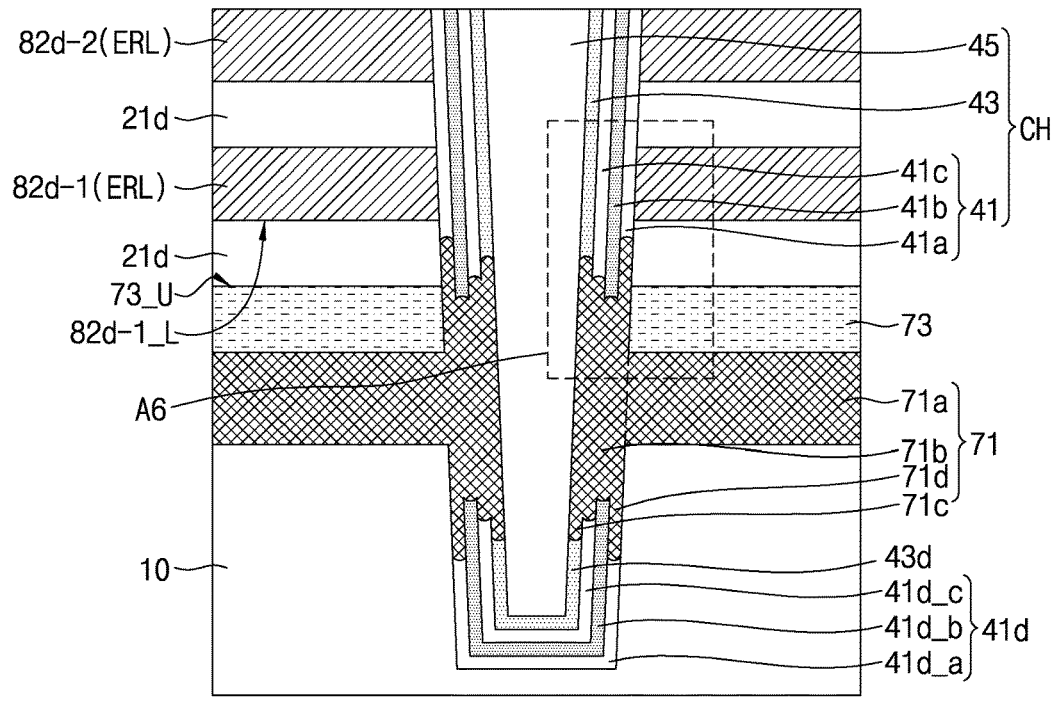
FIG. 9A is an enlarged view of the area P1 in FIG. 2 according to an embodiment of the inventive concept.
Figure 9B:
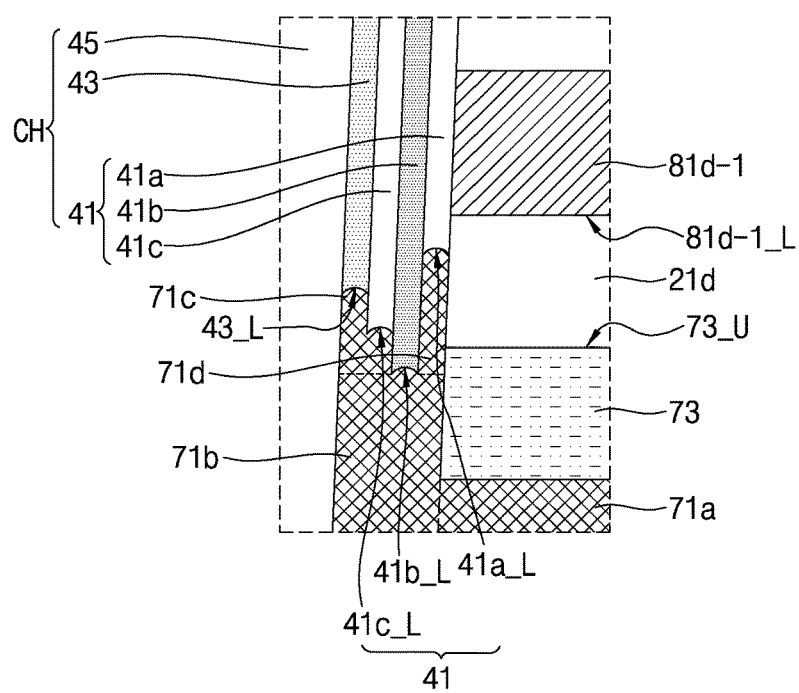
FIG. 9B is an enlarged view of an area A6 in FIG. 6A.
Figure 10A:
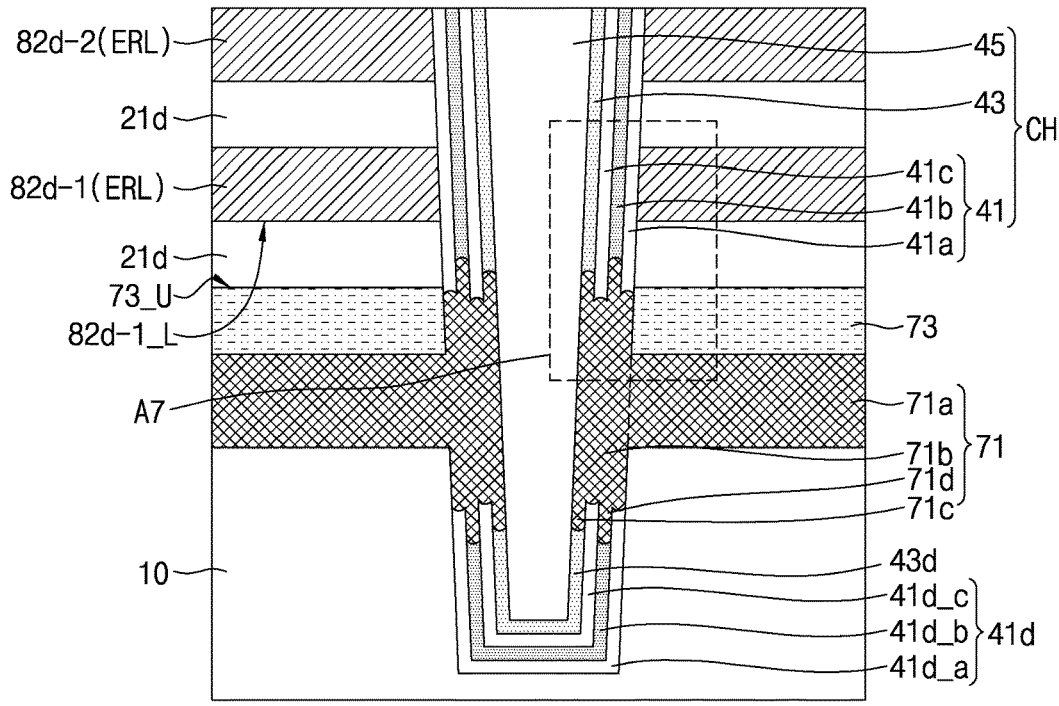
FIG. 10A is an enlarged view of the area P1 in FIG. 2 according to an embodiment of the inventive concept.
Figure 10B:
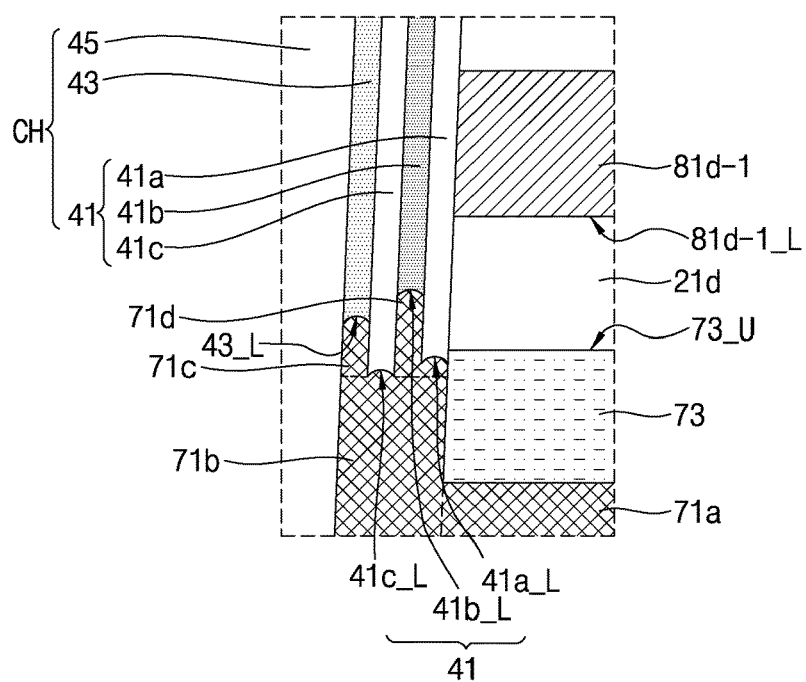
FIG. 10B is an enlarged view of an area A7 in FIG. 10A.

FIG. 7A is an enlarged view of the area P1 in FIG. 2 according to an embodiment of the inventive concept. FIG. 7B is an enlarged view of an area A4 in FIG. 7A. FIG. 8A is an enlarged view of the area P1 in FIG. 2 according to an embodiment of the inventive concept. FIG. 8B is an enlarged view of an area A5 in FIG. 8A. FIG. 9A is an enlarged view of the area P1 in FIG. 2 according to an embodiment of the disclosure. FIG. 9B is an enlarged view of an area A6 in FIG. 6A. FIG. 10A is an enlarged view of the area P1 in FIG. 2 according to an embodiment of the inventive concept. FIG. 10B is an enlarged view of an area A7 in FIG. 10A.

Referring to FIGS. 7A to 10B, in an embodiment, the lower source conductive pattern 71 may include a plurality of protrusions 71c and 71d. The plurality of protrusions 71c and 71d may include a first protrusion 71c and a second protrusion 71d. The first protrusion 71c and the second protrusion 71d may be horizontally spaced apart from each other in the cross-sectional views of FIGS. 7A-10B. The first protrusion 71c and the second protrusion 71d may have different heights in the cross-sectional views of FIGS. 7A-10B. In an embodiment, heights of the first protrusion 71c and the second protrusion 71d may be substantially equal in a cross-sectional view of the semiconductor device. In an embodiment, at least one of the first protrusion 71c or the second protrusion 71d may have an upper surface having portions disposed at different levels in a cross-sectional view of the semiconductor device. In an embodiment, at least one of the first protrusion 71c or the second protrusion 71d may have a flat upper surface.

In an embodiment, at least a portion of the upper surface of the first protrusion 71c may be disposed at a level higher than the upper surface 73_U of the upper source conductive pattern 73, but lower than the lower surface 82d-1_L of the lowermost gate electrode 82d-1 as shown, for example, in the cross-sectional view of FIG. 7B. In addition, at least a portion of the upper surface of the second protrusion 71d may be disposed at a level higher than the upper surface 73_U of the upper source conductive pattern 73, but lower than the lower surface 82d-1_L of the lowermost gate electrode 82d-1 as shown, for example, in the cross-sectional view of FIG. 7B.

As the lower source conductive pattern 71 includes the plurality of protrusions 71c and 71d, as described above, the lower surface 43_L of the channel pattern 43 and the lower surface 41_L of the data storage pattern 41 physically contacting the upper surface of the lower source conductive pattern 71 may be disposed at different levels in a cross-sectional view of the semiconductor device. In addition, different portions of the lower surface 41_L of the data storage pattern 41 may be disposed at different levels in a cross-sectional view of the semiconductor device. For example, a portion of the lower surface of the data storage pattern 41, e.g., 41a_L and 41c_L, may be disposed at a higher level than the upper surface 73_U of the upper source conductive pattern 73, and another portion of the lower surface of the data storage pattern 41, e.g., 41b_L, may be disposed at a lower level than the upper surface 73_U of the upper source conductive pattern 73 as shown in the cross-sectional view of FIG. 7B.

Referring to FIGS. 7A to 8B, in an embodiment, the lower surface 43_L of the channel pattern 43 may be disposed at a higher level than an uppermost portion of the lower surface of the data storage pattern 41. That is, the lower surface 43_L of the channel pattern 43 may be disposed at a higher level than an uppermost one of lower surfaces 41a_L, 41b_L and 41c_L of the blocking layer 41a, the charge storage layer 41b, and the tunnel insulating layer 41c in the cross-sectional views of FIGS. 7A-8B.

In detail, referring to FIGS. 7A and 7B, in an embodiment, the lower surface 41c_L of the tunnel insulating layer 41c is disposed at a higher level than the lower surface 41b_L of the charge storage layer 41b, and the lower surface 41a_L of the blocking layer 41a may be disposed at a higher level than the lower surface 41c_L of the tunnel insulating layer 41c. The lower surface 43_L of the channel pattern 43 may be disposed at a higher level than the lower surface 41c_L of the tunnel insulating layer 41c in the cross-sectional views of FIGS. 7A-7B.

Referring to FIGS. 8A and 8B, in an embodiment, the lower surface 41a_L of the blocking layer 41a may be disposed at a higher level than the lower surface 41c_L of the tunnel insulating layer 41c, and the lower surface 41b_L of the charge storage layer 41b may be disposed at a higher level than the lower surface 41a_L of the blocking layer 41a. The lower surface 43_L of the channel pattern 43 may be disposed at a higher level than the lower surface 41b_L of the charge storage layer 41b in the cross-sectional views of FIGS. 8A-8B. The lower surface 43_L of the channel pattern 43 and the lower surface 41b_L of the charge storage layer 41b may be disposed at a higher level than the upper surface 73_U of the upper source conductive pattern 73 in the cross-sectional views of FIGS. 8A-8B. The lower surface 41a_L of the blocking layer 41a and the lower surface 41c_L of the tunnel insulating layer 41c may be disposed at a lower level than the upper surface 73_U of the upper source conductive pattern 73 in the cross-sectional views of FIGS. 8A-8B. Alternatively, in an embodiment, the lower surface 41a_L of the blocking layer 41a may be disposed at a higher level than the upper surface 73_U of the upper source conductive pattern 73, and only the lower surface 41c_L of the tunnel insulating layer 41c may be disposed at a lower level than the upper surface 73_U of the upper surface conductive pattern 73 in a cross-sectional view of the semiconductor device.

Referring to FIGS. 9A to 10B, in an embodiment, the lower surface 43_L of the channel pattern 43 may be disposed at a lower level than an uppermost portion of the lower surface 41L of the data storage pattern 41. That is, the lower surface 43_L of the channel pattern 43 may be disposed at a lower level than an uppermost one of the lower surfaces of the blocking layer 41a, the charge storage layer 41b and the tunnel insulating layer 41c in the cross-sectional views of FIGS. 9A-10B. The uppermost surface of the data storage pattern 41 may be disposed at a level higher than the lower surface 43_L of the channel pattern 43, but lower than the lower surface 82d-1_L of the lowermost gate electrode in the cross-sectional views of FIGS. 9A-10B.

In detail, referring to FIGS. 9A and 9B, the lower surface 41c_L of the tunnel insulating layer 41c may be disposed at a higher level than the lower surface 41b_L of the charge storage layer 41b. The lower surface 43_L of the channel pattern 43 may be disposed at a higher level than the lower surface 41c_L of the tunnel insulating layer 41c, and the lower surface 41a_L of the blocking layer 41a may be disposed at a higher level than the lower surface 43_L of the channel pattern 43 in the cross-sectional views of FIGS. 9A-9B. The lower surface 41a_L of the blocking layer 41a and the lower surface 43_L of the channel pattern 43 may be disposed at a higher level than the upper surface 73_U of the upper source conductive pattern 73 in the cross-sectional views of FIGS. 9A-9B. The lower surface 41c_L of the tunnel insulating layer 41c may be disposed at a higher level than the upper surface 73_U of the upper source conductive pattern 73, and the lower surface 41b_L of the charge storage layer 41b may be disposed at a lower level than the upper surface 73_U of the upper source conductive pattern 73 in the cross-sectional views of FIGS. 9A-9B. Alternatively, in an embodiment, the lower surface 41c_L of the tunnel insulating layer 41c and the lower surface 41b_L of the charge storage layer 41b may be disposed at lower levels than the upper surface 73_U of the upper source conductive pattern 73, respectively in a cross-sectional view of the semiconductor device.

Referring to FIGS. 10A and 10B, the lower surface 41a_L of the blocking layer 41a may be disposed at a higher level than the lower surface 41c_L of the tunnel insulating layer 41c, and the lower surface 43_L of the channel pattern 43 may be disposed at a higher level than the lower surface 41a_L of the blocking layer 41a. The lower surface 41b_L of the charge storage layer 41b may be disposed at a higher level than the lower surface 43_L of the channel pattern 43 in the cross-sectional views of FIGS. 10A-10B. For example, the lower surface 43_L of the channel pattern 43 and the lower surface 41b_L of the charge storage layer 41b may be disposed at higher levels than the upper surface 73_U of the upper source conductive pattern 73, respectively in the cross-sectional views of FIGS. 10A-10B. The lower surface 41a_L of the blocking layer 41a and the lower surface 41c_L of the tunnel insulating layer 41c may be disposed at lower levels than the upper surface 73_U of the upper source conductive pattern 73, respectively, in the cross-sectional views of FIGS. 10A-10B. Alternatively, in an embodiment, the lower surface 41a of the blocking layer 41a may be disposed at a higher level than the upper surface 73_U of the upper source conductive pattern 73, and the lower surface 41c_L of the tunnel insulating layer 41c may be disposed at a lower level than the upper surface 73_U of the upper source conductive pattern 73 in a cross-sectional view of the semiconductor device.

Figure 11A:
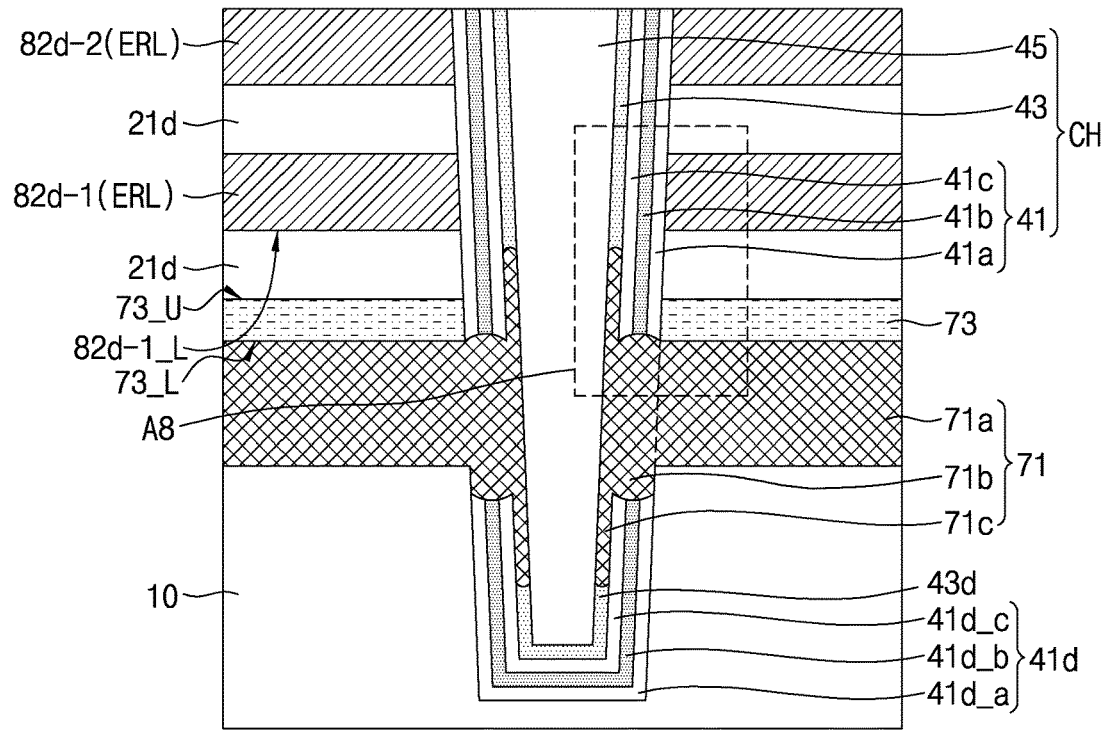
FIG. 11A is an enlarged view of the area P1 in FIG. 2 according to an embodiment of the inventive concept.
Figure 11B:
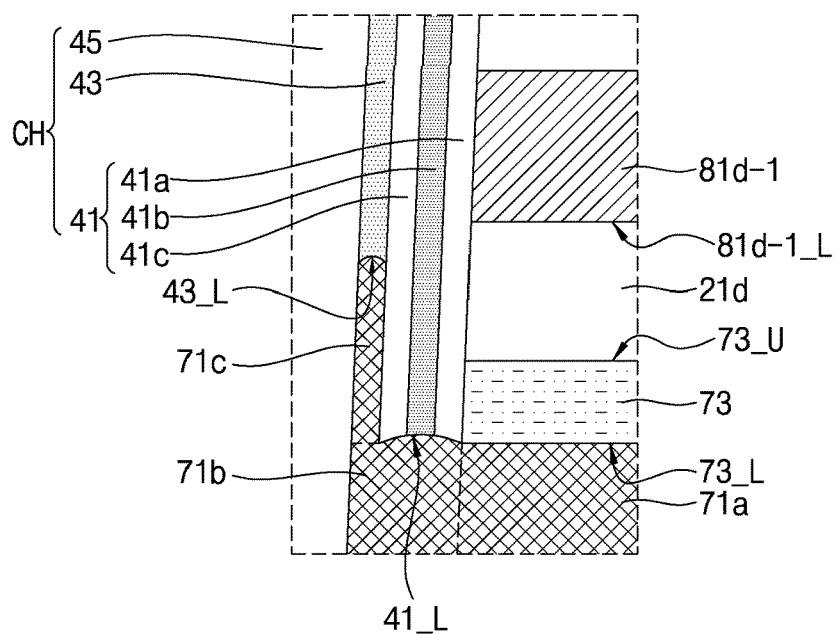
FIG. 11B is an enlarged view of an area A8 in FIG. 11A.
Figure 12A:
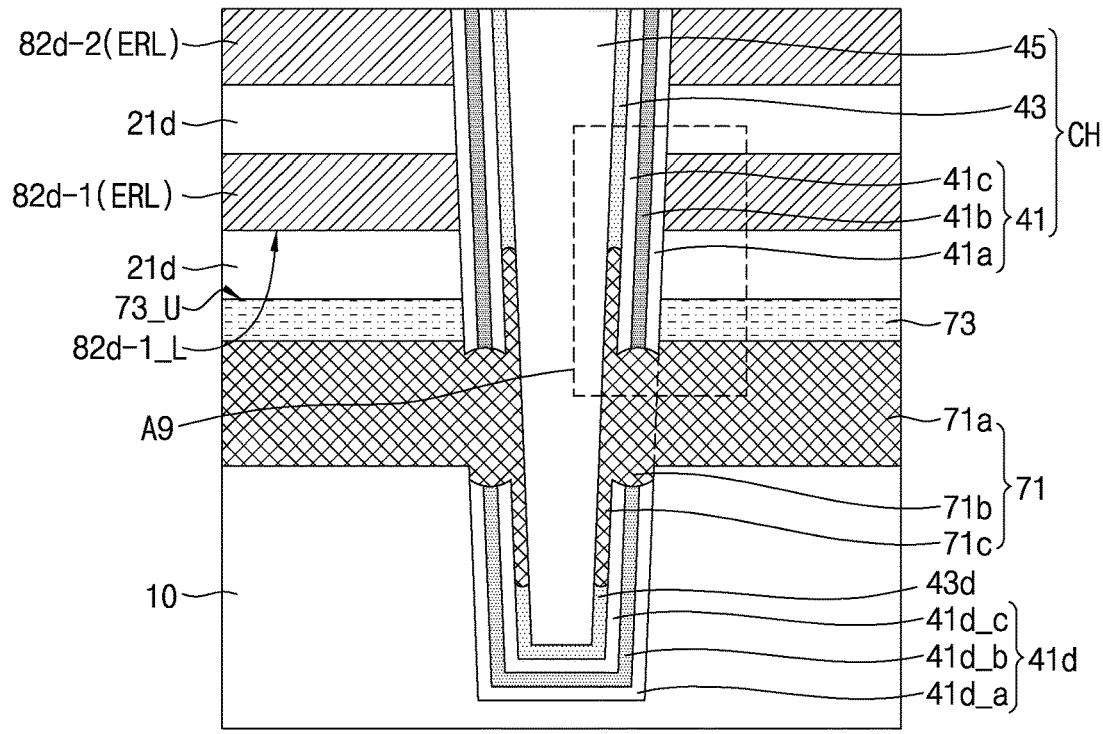
FIG. 12A is an enlarged view of the area P1 in FIG. 2 according to an embodiment of the inventive concept.
Figure 12B:
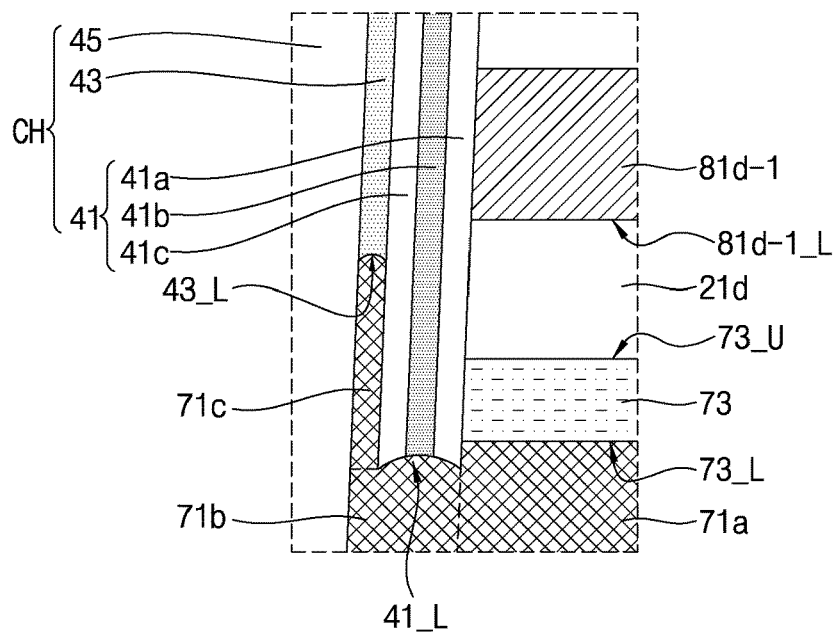
FIG. 12B is an enlarged view of an area A9 in FIG. 12A.

FIG. 11A is an enlarged view of the area P1 in FIG. 2 according to an embodiment of the inventive concept. FIG. 11B is an enlarged view of an area A8 in FIG. 11A. FIG. 12A is an enlarged view of the area P1 in FIG. 2 according to an embodiment of the inventive concept. FIG. 12B is an enlarged view of an area A9 in FIG. 12A.

Referring to FIGS. 11A and 11B, the lower surface 41_L of the data storage pattern 41 may be disposed at substantially the same level as the lower surface 73_L of the upper source conductive pattern 73. That is, the upper surface of the vertical extension 71b and the upper surface of the horizontal extension 71a may be disposed at substantially the same level in the cross-sectional views of FIGS. 11A and 11B. The vertical length of the protrusion 71c may be greater than the thickness of the upper source conductive pattern 73 in a vertical direction as shown in the cross-sectional views of FIGS. 11A and 11B.

Referring to FIGS. 12A and 12B, in an embodiment, the lower surface 41_L of the data storage pattern 41 may be disposed at a lower level than the lower surface 73_L of the upper source conductive pattern 73. Accordingly, a portion of the data storage pattern 41 may be disposed between the protrusion 71c and the horizontal extension 71a.

As illustrated in FIGS. 4A to 12B, the lower surface 43_L of the channel pattern 43 may be disposed at a higher level than the upper surface 73_U of the upper source conductive pattern 73. In some embodiments, the lower surface 43_L of the channel pattern 43 is disposed at substantially the same level as the lower surface 82d-1_L of the erase control transistor 82d-1 (ERL) in a cross-sectional view of the semiconductor device. In addition, at least a portion of the lower surface 41_L of the data storage pattern 41 may be disposed at a higher level than the upper surface 73_U of the upper source conductive pattern 73 in a cross-sectional view of the semiconductor device. As the level of the lower surface 43_L of the channel pattern 43 and the level of the lower surface 41_L of the data storage pattern 41 are appropriately configured, as described above, it may be possible to form the lower source conductive pattern 71 such that at least a portion thereof is disposed near the lowermost gate electrode 82d-1, that is, the erase control transistor ERL. Accordingly, it may be possible to appropriately control the physical diffusion distance of the impurity between the lower source conductive pattern 71 and the erase control transistor ERL.

In addition, C and/or N may be included in the lower surface 43_L of the channel pattern 43 or a region therebeneath. Accordingly, even when the physical distance between the lower source conductive pattern 71 and the erase control transistor ERL is very small, diffusion of the impurity may be appropriately controlled.

FIGS. 13 to 24 are sectional views that illustrate a method for manufacturing the semiconductor device in accordance with an example embodiment of the inventive concept.

Figure 13:
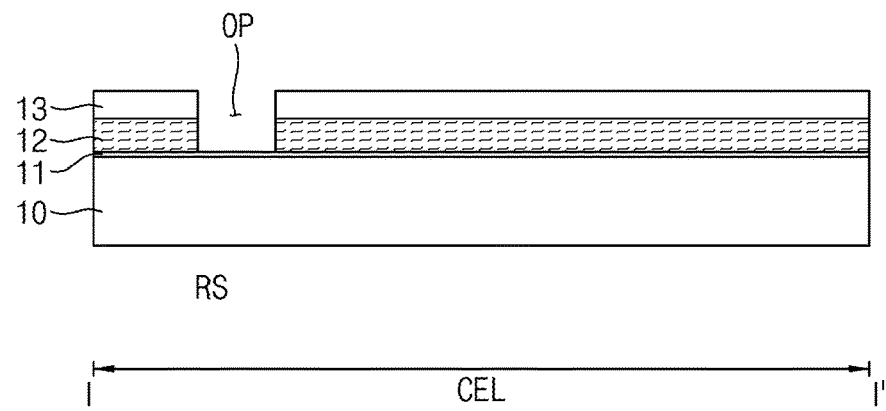
FIGS. 13 to 24 are sectional views illustrating a method for manufacturing the semiconductor device in accordance with an example embodiment of the inventive concept.

Referring to FIG. 13, the method may include forming an insulating film 11 on a substrate 10, and forming a lower sacrificial pattern 12 and a mask pattern 13 on the insulating film 11.

The substrate 10 may be a semiconductor substrate. For example, the substrate 10 may be a silicon substrate, a germanium substrate, and/or a silicon-germanium substrate. The insulating film 11 may include, for example, silicon oxide.

Formation of the lower sacrificial pattern 12 may include forming a lower sacrificial film on the insulating film 11, forming the mask pattern 13 on the lower sacrificial film, and etching the lower sacrificial film using the mask pattern 13 as an etch mask. As the lower sacrificial film is partially etched, the lower sacrificial pattern 12, which has an opening OP, may be formed. An upper surface of the insulating film 11 may be partially exposed through the opening OP.

The lower sacrificial pattern 12 may include a material having etch selectivity with respect to the insulating film 11. For example, the lower sacrificial pattern 12 may include silicon nitride, silicon oxynitride, silicon carbide, and/or silicon germanium. The mask pattern 13 may be removed after formation of the lower sacrificial pattern 12.

Figure 14:
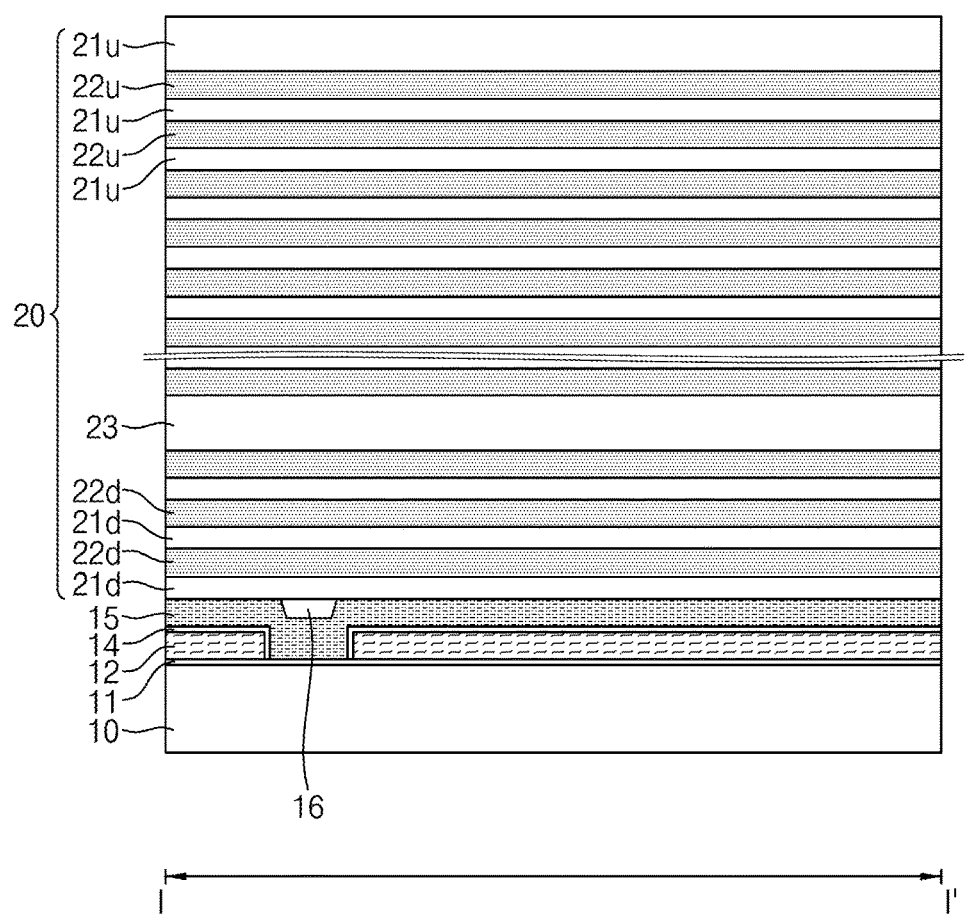

Referring to FIG. 14, the method may further include forming a liner 14 on and at least partially covering the lower sacrificial pattern 12, forming a source conductive layer 15 on the liner 14, forming a buffer layer 16 on the source conductive layer 15, and forming a stack structure 20.

The liner 14 may be on and may at least partially conformally cover upper and side surfaces of the lower sacrificial pattern 12. For example, the liner 14 may include silicon oxide. The source conductive layer 15 may be on and at least partially cover upper and side surfaces of the liner 14 while at least partially filling the opening OP. The source conductive layer 15 may be formed to have a uniform thickness and, as such, may have an upper surface recessed at a position vertically overlapping the opening OP in the cross-sectional view of FIG. 14. For example, the source conductive layer 15 may include a polysilicon film doped with an N-type impurity (for example, phosphorous (P) or arsenic (As)).

The buffer layer 16 may be formed on the recessed upper surface of the source conductive layer 15. Formation of the buffer layer 16 may include forming an insulating film on the source conductive layer 15, and planarizing the insulating film to expose the upper surface of the source conductive layer 15. For example, the insulating film 11 may include silicon oxide.

Formation of the stack structure 20 may include alternately stacking insulating layers 21d, 21u and 23 and sacrificial layers 22d and 22u on the source conductive layer 15. The insulating layers 21d, 21u and 23 may include a material having etch selectivity with respect to the sacrificial layers 22d and 22u. In an embodiment, the sacrificial layers 22d and 22u may include the same material as the lower sacrificial pattern 12. For example, the sacrificial layers 22d and 22u may include silicon nitride, and the insulating layers 21d, 21u and 23 may include silicon oxide.

The insulating layers 21d, 21u and 23 are disposed between vertically neighboring ones of the sacrificial layers 22d and 22u, respectively, and may include a planarization layer 23 having a greater thickness than the insulating layers 21d, 21u and the sacrificial layers 22d and 22u. The insulating layers 21d, 21u and 23 may include lower insulating layers 21d disposed below the planarization layer 23, and upper insulating layers 21u disposed above the planarization layer 23 in the cross-sectional view of FIG. 14. Similarly, the sacrificial layers 22d and 22u may include lower sacrificial layers 22d disposed below the planarization layer 23, and upper sacrificial layers 22u disposed above the planarization layer 23 in the cross-sectional view of FIG. 14.

Figure 15:
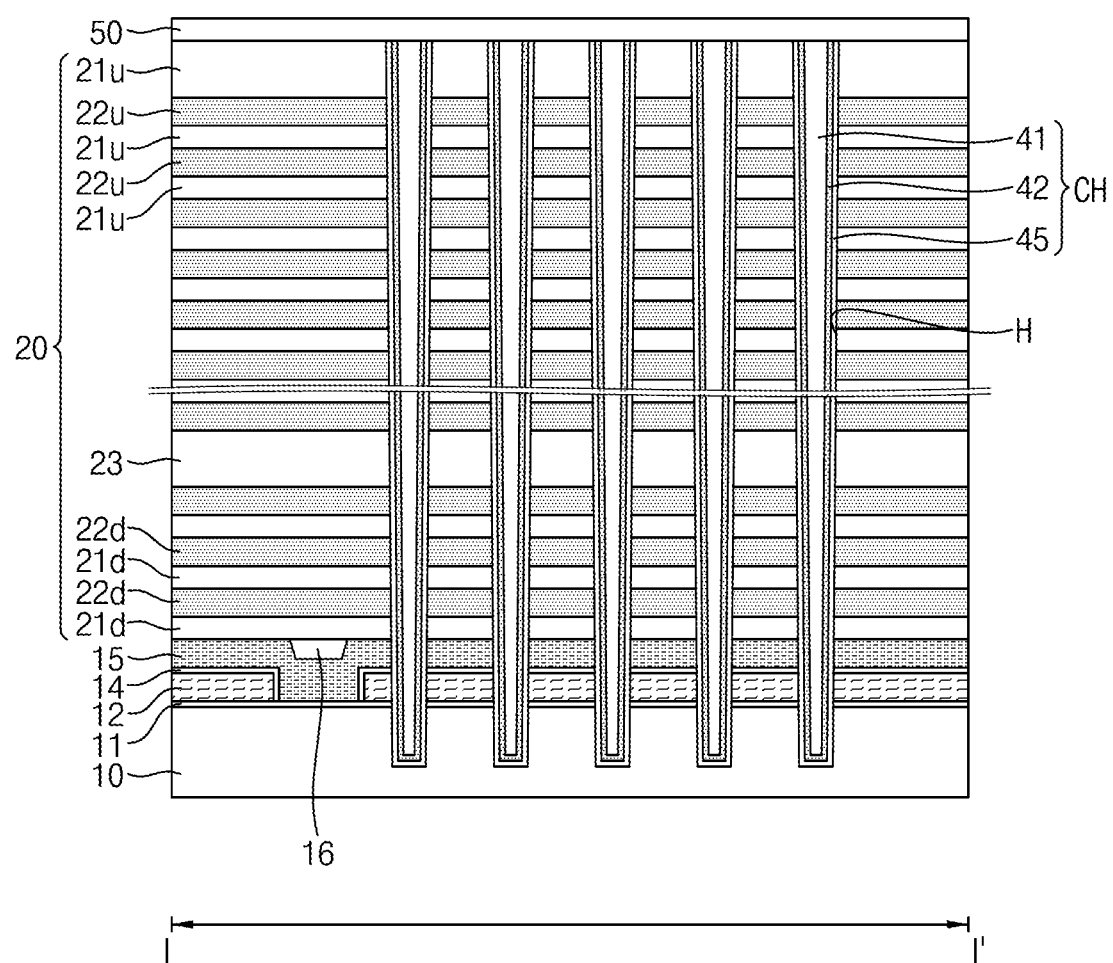

Referring to FIG. 15, the method may further include forming a channel structure CH extending through the insulating film 11, the lower sacrificial pattern 12, the liner 14, the source conductive layer 15 and the stack structure 20, and forming a capping layer 50 on the stack structure 20 and the channel structure CH.

Formation of the channel structure CH may include forming a channel hole H extending through the stack structure 20, the source conductive layer 15, the liner 14 and the lower sacrificial pattern 12. The channel hole H may expose the substrate 10 therethrough. Formation of the channel structure CH may include sequentially forming a data storage pattern 41, a channel layer 42, an insulating pattern 45, and a conductive pad 47 in the channel hole H.

Each of the data storage pattern 41 and the channel layer 42 may be conformally formed in the channel hole H, and may incompletely fill the channel hole H. The insulating pattern 45 may be in and at least partially fill a space remaining in the channel hole H after formation of the data storage pattern 41 and the channel layer 42. The data storage pattern 41 may include a blocking layer, a charge storage layer and a tunnel insulating layer, which are sequentially stacked.

Formation of the channel layer 42 may include conformally depositing a semiconductor layer on the data storage pattern 41 through a chemical vapor deposition (CVD) process or an atomic layer deposition (ALD) process, and performing a planarization process. The channel layer 42 may include a semiconductor doped with an impurity, or may be an intrinsic semiconductor undoped with an impurity.

The conductive pad 47 may be formed on the data storage pattern 41, the channel layer 42 and the insulating pattern 45 in the channel hole H. After formation of the conductive pad 47, the capping layer 50 may be formed to cover an upper surface of the stack structure 20 and an upper surface of the conductive pad 47.

Figure 16:
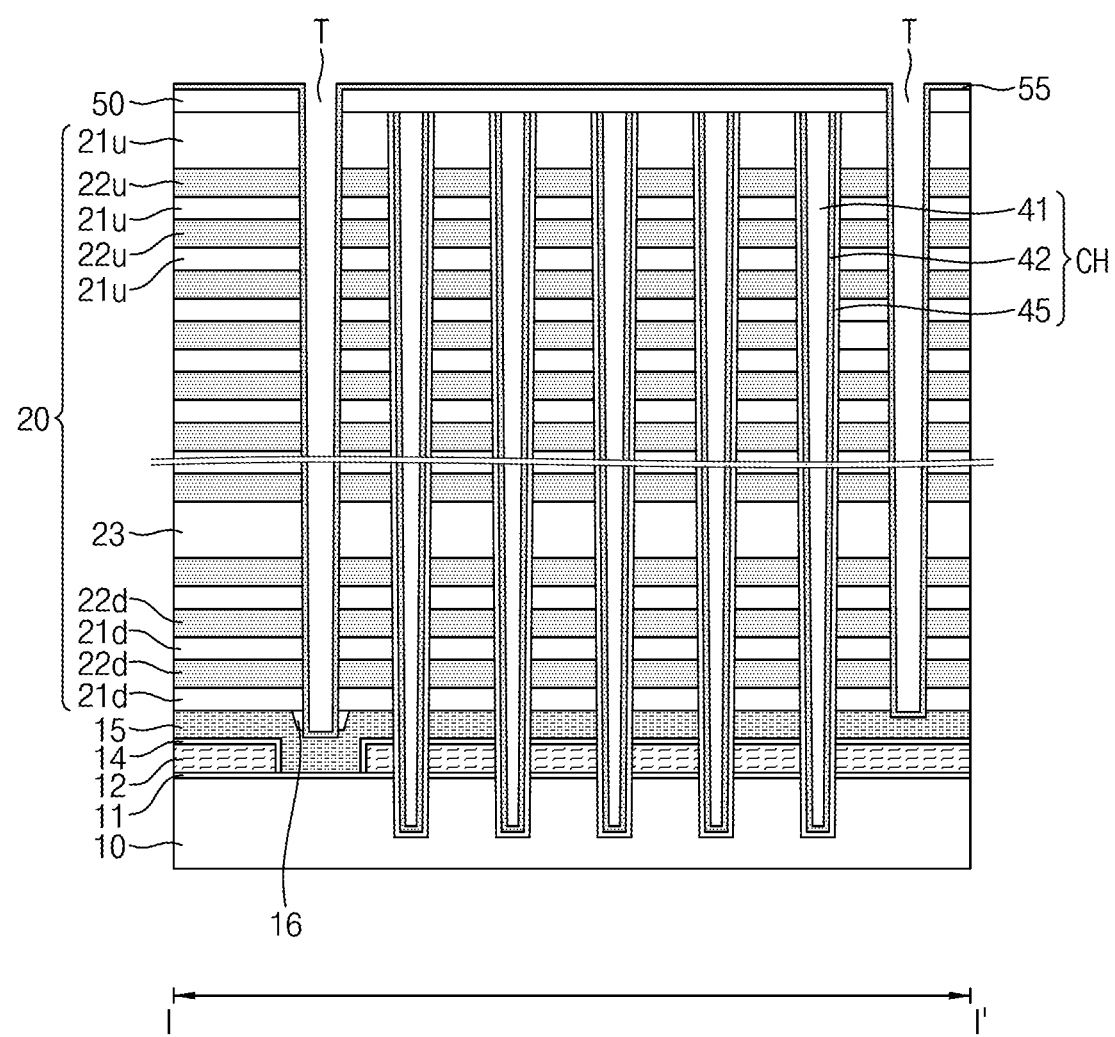

Referring to FIG. 16, the method may further include forming a trench T extending through the capping layer 50 and the stack structure 20, and forming a sacrificial spacer layer 55 in the trench T. The trench T may expose the source conductive layer 15 therethrough. In an embodiment, the trench T may extend through the buffer layer 16, thereby forming a buffer pattern BF.

The sacrificial spacer layer 55 may be conformally formed to be on and at least partially cover an upper surface of the capping layer 50 while at least partially filling a portion of the trench T. For example, the sacrificial spacer layer 55 may include a polysilicon film.

Figure 17:
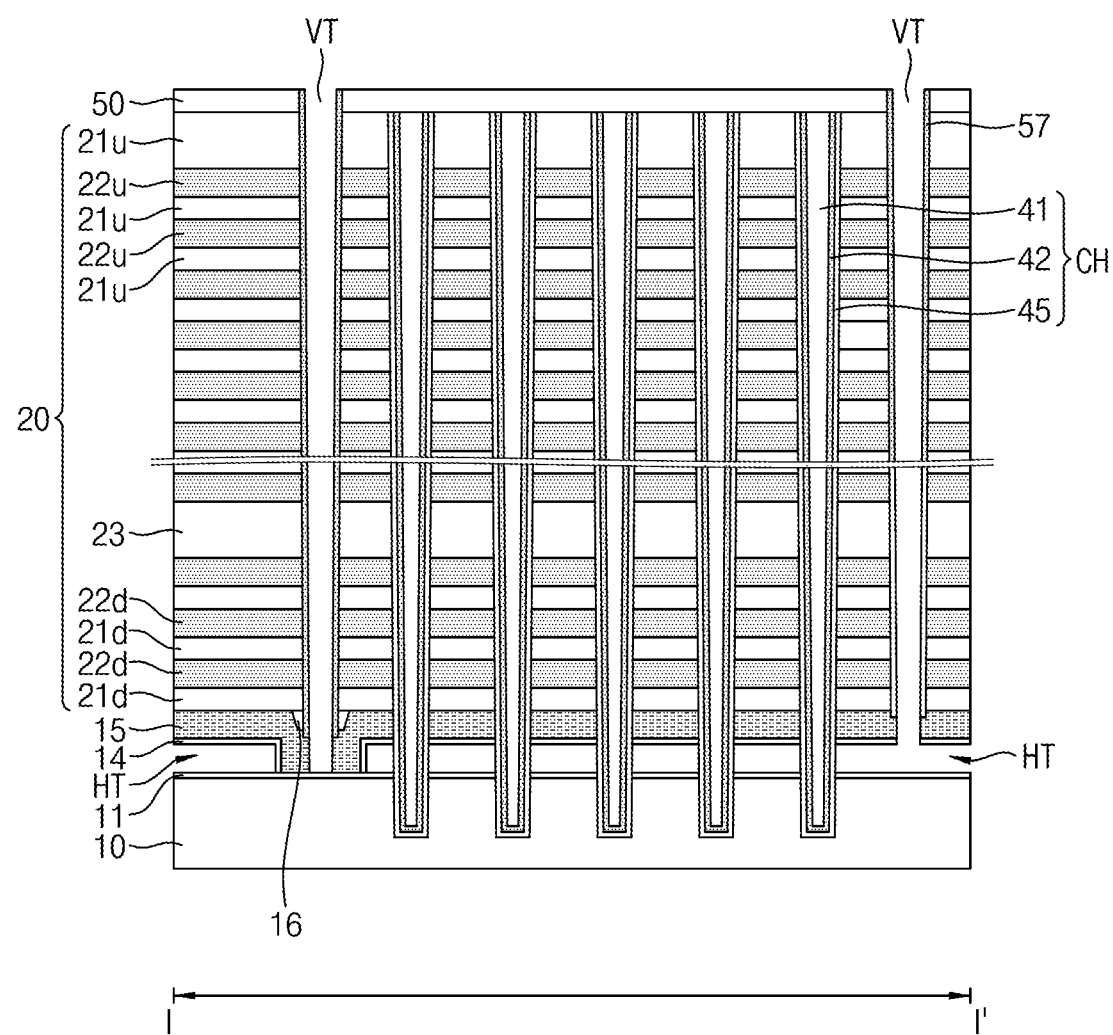

Referring to FIG. 17, the method may further include forming a sacrificial spacer 57 and a vertical through hole area VT, and removing the lower sacrificial pattern 12.

Formation of the sacrificial spacer 57 may include anisotropically etching the sacrificial spacer layer 55. The source conductive layer 15 and the liner 14 may be partially etched in accordance with an anisotropic etching process for the sacrificial spacer layer 55. Accordingly, the trench T further extends vertically downwards in the cross-sectional view of FIG. 17 and, as such, the vertical through hole area VT may be formed such that the lower sacrificial pattern 12 is exposed through the vertical through hole area VT. The vertical through hole area VT may expose the insulating film 11 therethrough or may expose an upper surface of the substrate 10 therethrough.

Removal of the lower sacrificial pattern 12 may include forming a horizontal through hole area HT through execution of an isotropic etching process for the vertical through hole area VT. The horizontal through hole area HT may partially expose an outer side surface of the channel structure CH, that is, the data storage pattern 41, therethrough. In addition, the horizontal through hole area HT may expose an inner side surface of the liner 14 and the upper surface of the insulating film 11 therethrough. The isotropic etching process may be performed using an etching condition having etch selectivity with respect to the sacrificial spacer 57, the source conductive layer 15, the liner 14, the insulating film 11, and the buffer pattern BF.

The source conductive layer 15 may function as a support to prevent or reduce the likelihood that the stack structure 20 collapses during formation of the horizontal through hole area HT.

Figure 18:
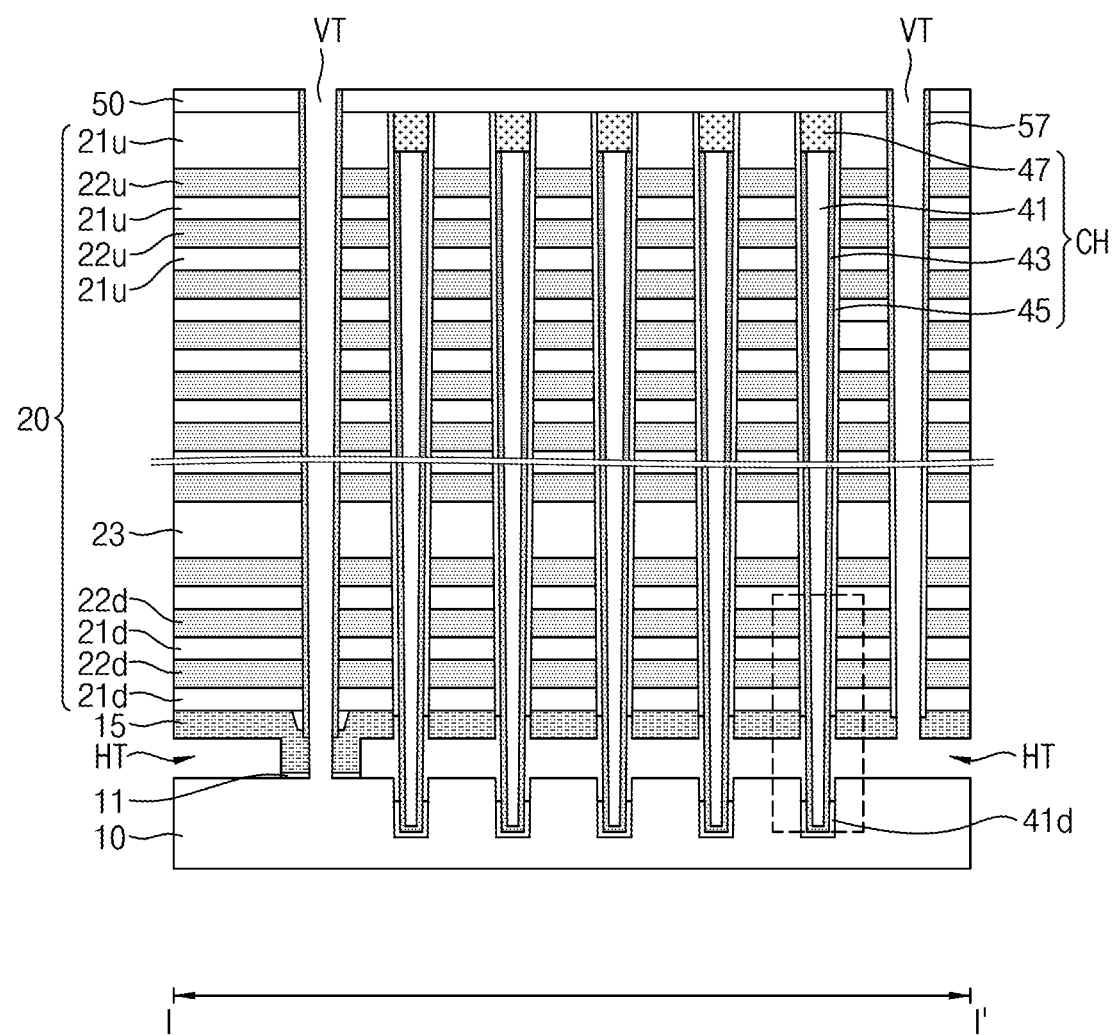
Figure 19:
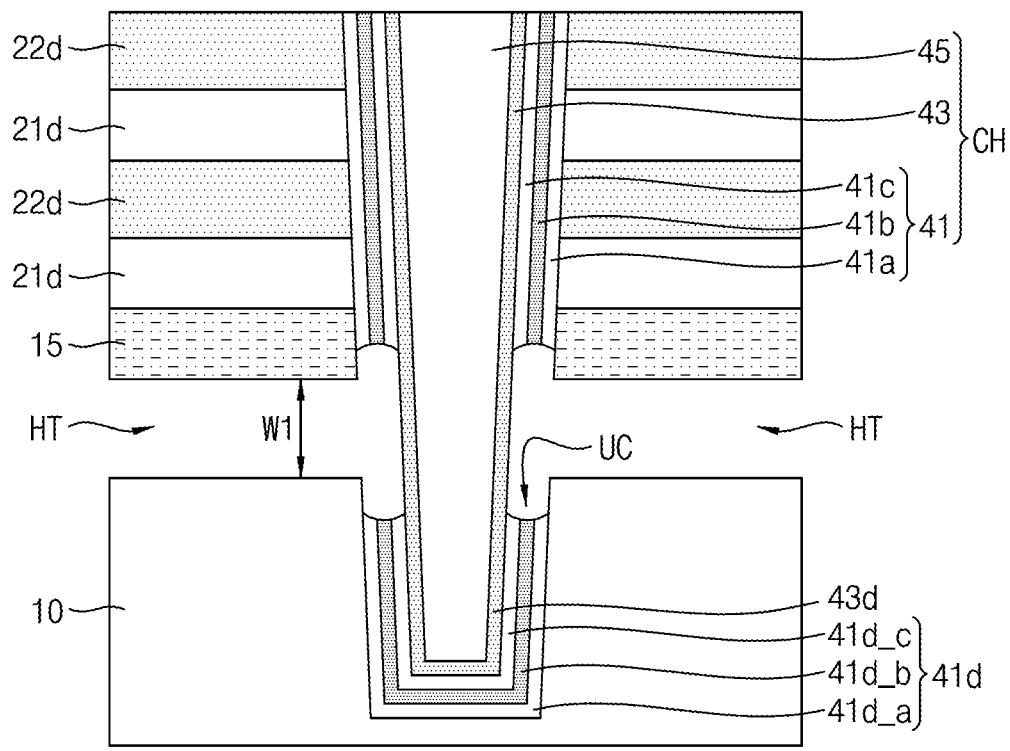

Referring to FIGS. 18 and 19, the method may further include removing a portion of the data storage pattern 41 exposed through the horizontal through hole area HT, thereby exposing a portion of a side surface of the channel layer 42. As the portion of the data storage pattern 41 is removed, the data storage pattern 41 may be divided into a data storage pattern 41 and a dummy data storage pattern 41d which are vertically spaced apart from each other as shown in the cross-sectional view of FIG. 19. A portion of the channel layer 42 may be exposed between the data storage pattern 41 and the dummy data storage pattern 41d which are vertically spaced apart from each other.

Removal of the portion of the data storage pattern 41 may include partially removing the insulating film 11, and removing the liner 14. Accordingly, a lower surface of the source conductive layer 15 and the upper surface of the substrate may be exposed through the horizontal through hole area HT.

As the portion of the data storage pattern 41 is removed, an undercut area UC may be formed. The undercut area UC may be an area extending vertically from the horizontal through hole area HT in the cross-sectional view of FIG. 19. The undercut area UC may be formed as a portion of the data storage pattern 41 disposed below the upper surface of the substrate 10 is removed, and a portion of the data storage pattern 41 disposed above the lower surface of the source conductive layer 15 is removed. The undercut area UC may extend between the source conductive layer 15 and the channel layer 42 and between the substrate 10 and the channel layer 42.

Removal of the portion of the data storage pattern 41 may be performed through an etching process having etch selectivity with respect to the substrate 10, the source conductive layer 15, the channel layer 42, and the sacrificial spacer 57.

Profiles of a lower surface of the data storage pattern 41 and the upper surface of the dummy data storage pattern 41d may vary in accordance with variation of conditions of the etching process for partially removing the data storage pattern 41.

Figure 20:
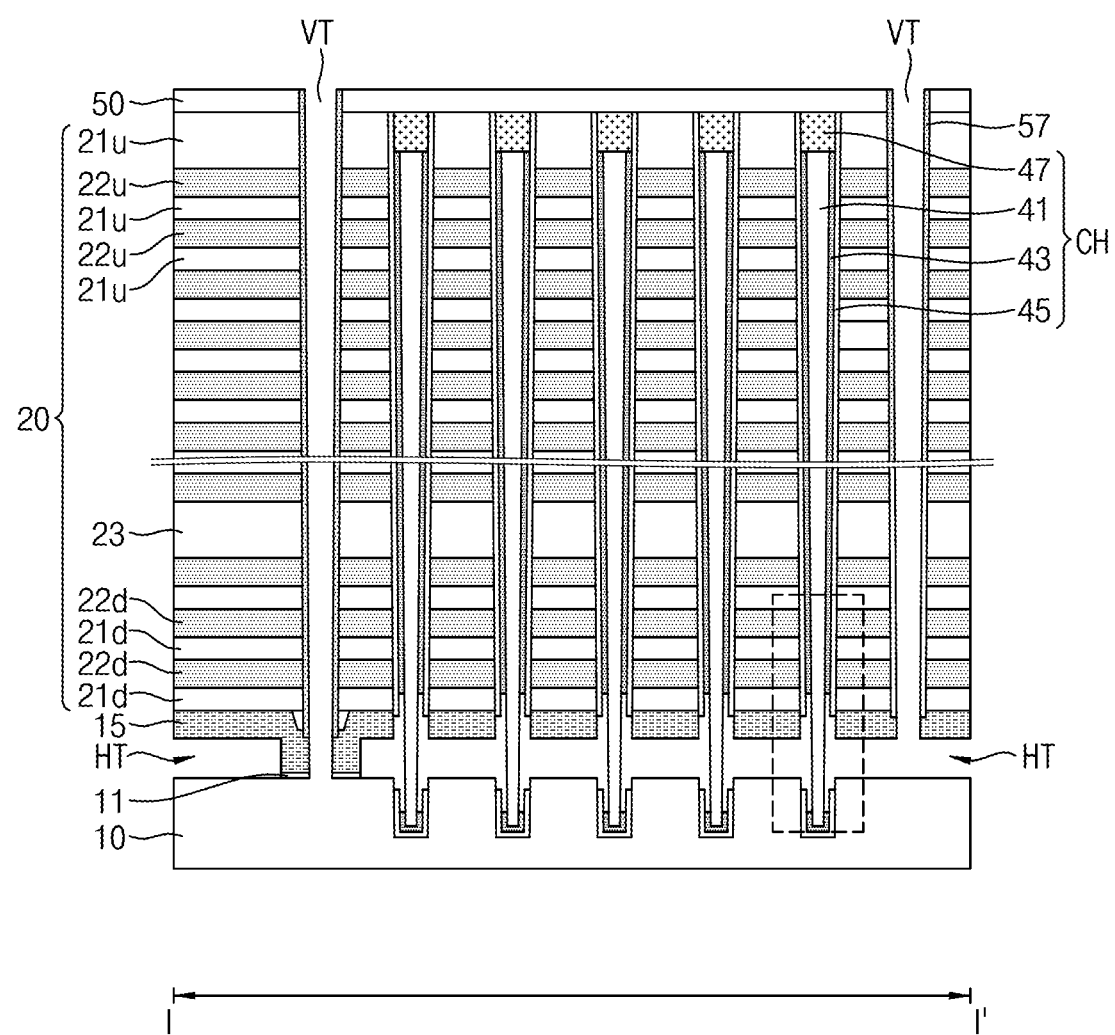
Figure 21:
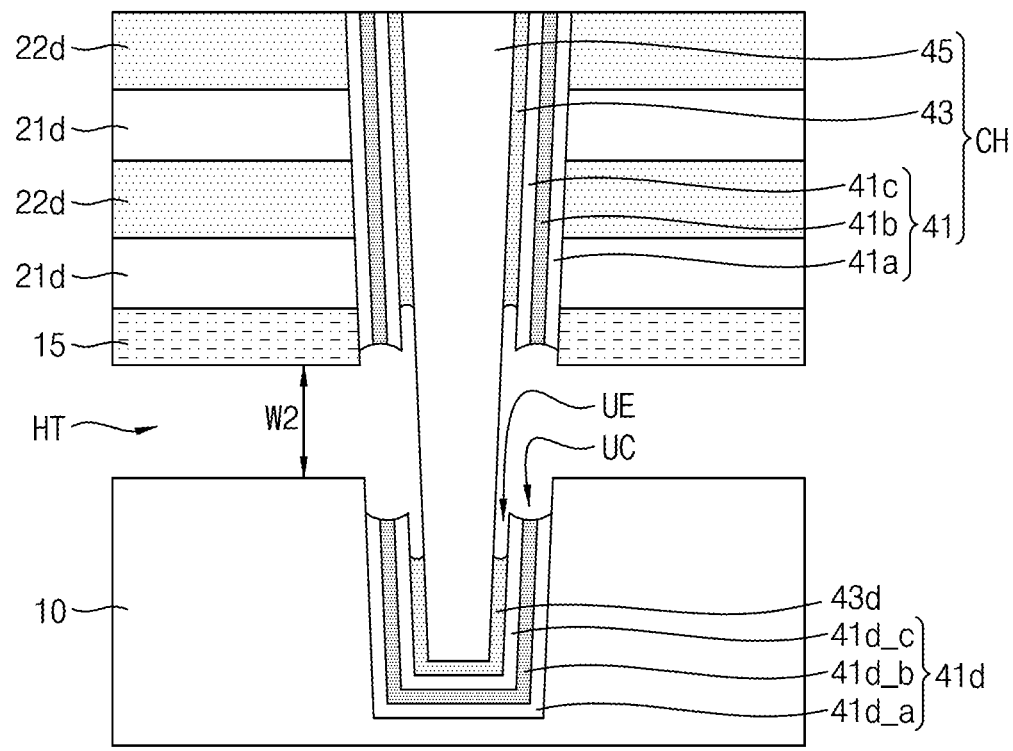

Referring to FIGS. 20 and 21, the method may further include removing a portion of the channel layer 42 exposed through the horizontal through hole area HT and the undercut area UC. As the portion of the channel layer 42 is removed, the channel layer 42 may be divided into a channel pattern 43 and a dummy channel pattern 43d which are vertically spaced apart from each other in the cross-sectional view of FIG. 21. A portion of the insulating pattern 45 may be exposed between the channel pattern 43 and the dummy channel pattern 43d, which are spaced apart from each other.

The source conductive layer 15 may also be partially removed in the process of partially removing the channel layer 42. As the source conductive layer 15 is partially removed, the horizontal through hole area HT may be expanded. Accordingly, a height W2 of the horizontal through hole area HT may be greater than a height W1 (see FIG. 19) of the horizontal through hole area HT before partial removal of the channel layer 42. In addition, the undercut area UC may be expanded in accordance with partial removal of the source conductive layer 15.

As the channel layer 42 is partially removed, an extended undercut area UE may be formed. The extended undercut area UE may be an area extending vertically from the undercut area UC. The extended undercut area UE extends between the data storage pattern 41 and the insulating pattern 45 and between the dummy data storage pattern 41d and the insulating pattern 45. As the extended undercut area UE is formed, the lower surface of the channel pattern 43 may be disposed above the lower surface of the data storage pattern 41, and the upper surface of the dummy channel pattern 43d may be disposed below the upper surface of the dummy data storage pattern 41d as shown in the cross-sectional view of FIG. 21.

In an embodiment, the extended undercut area UE may extend to a level corresponding to an upper surface of the lowermost insulating layer 21d (that is, a lower surface of the lowermost sacrificial layer 22d) disposed at a lowest level in the stack structure 20 in a cross-sectional view of the semiconductor device. That is, the upper surface of the channel pattern 43 may be disposed at a level equal to or higher than the upper surface of the source conductive layer 15, and may be disposed at a level equal to or lower than the upper surface of the lowermost insulating layer 21d (that is, the lower surface of the lowermost sacrificial layer 22d) in a cross-sectional view of the semiconductor device.

In an embodiment, the method may further include doping the lower surface of the channel pattern 43 with C or N. As C or N is formed at the lower surface of the channel pattern 43 or a lower portion of the channel pattern 43, diffusion of an N-type impurity may be controlled in a subsequent thermal treatment process for diffusing the N-type impurity (for a source conductive pattern to be subsequently formed). C or N may be implanted into the channel pattern 43 through the undercut area UC and/or the extended undercut area UE. C or N may not only be formed at the lower portion of the channel pattern 43, but also may be formed in a region adjacent to the lower portion of the channel pattern 43. For example, C or N may also be formed at a surface of the data storage pattern 41.

Figure 22:
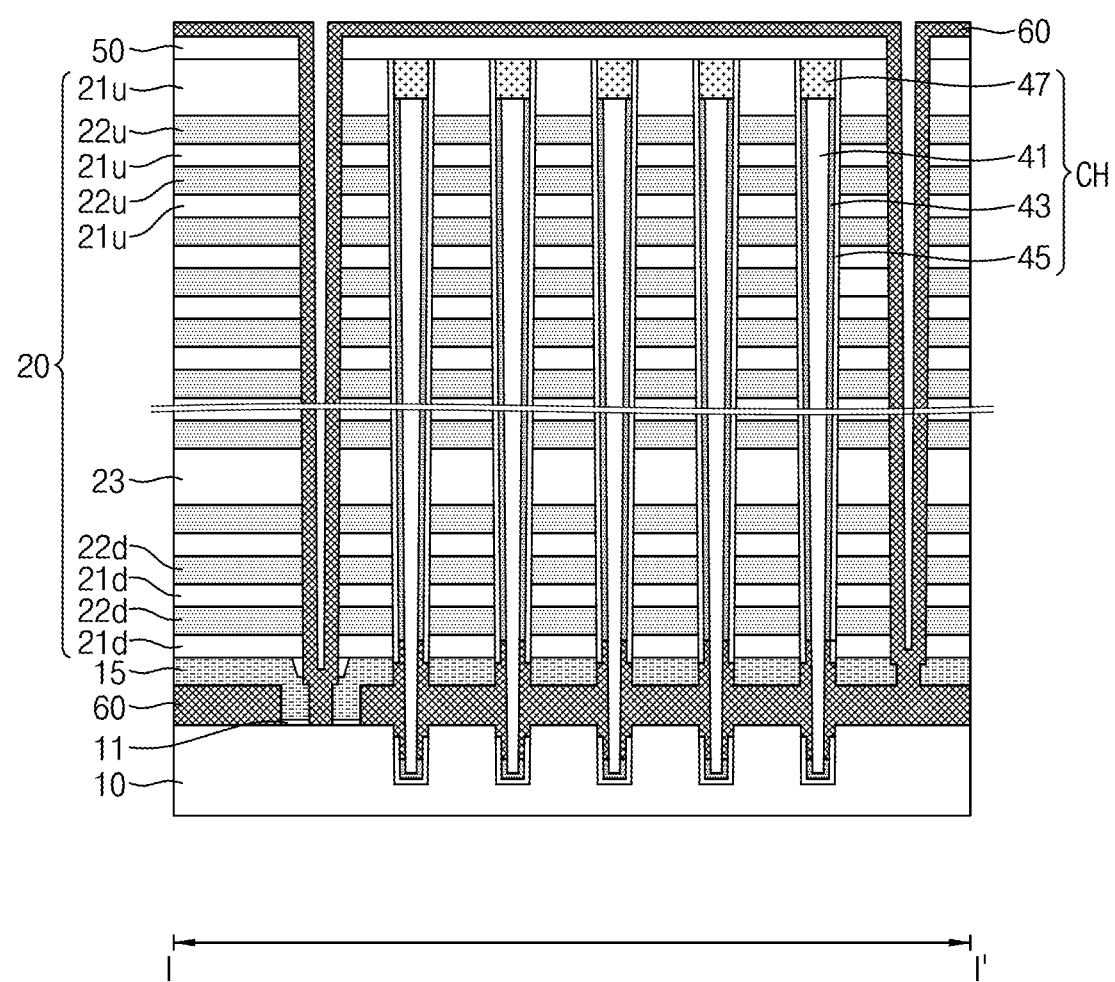

Referring to FIG. 22, the method may further include forming a conductive layer 60 in the horizontal through hole area HT, the undercut area UC, the extended undercut area UE, and the vertical through hole area VT.

For example, the conductive layer 60 may be formed using CVD or ALD. The conductive layer 60 may be a semiconductor layer doped with an impurity. For example, the conductive layer 60 may include a polysilicon doped with an impurity.

The conductive layer 60 may be on and at least partially cover inner surfaces of the horizontal through hole area HT, the undercut area UC, the extended undercut area UE and the vertical through hole area VT in a uniform thickness. The conductive layer 60 may incompletely fill the vertical through hole area VT. An air gap or a seam may be formed at a portion of the conductive layer 60 in the horizontal through hole area HT. The conductive layer 60 may be directly on and at least partially cover a side surface of the insulating pattern 45. In addition, the conductive layer 60 may directly physically contact the source conductive layer 15, the data storage pattern 41, the channel pattern 43, the dummy data storage pattern 41d, and the dummy channel pattern 43d.

Figure 23:
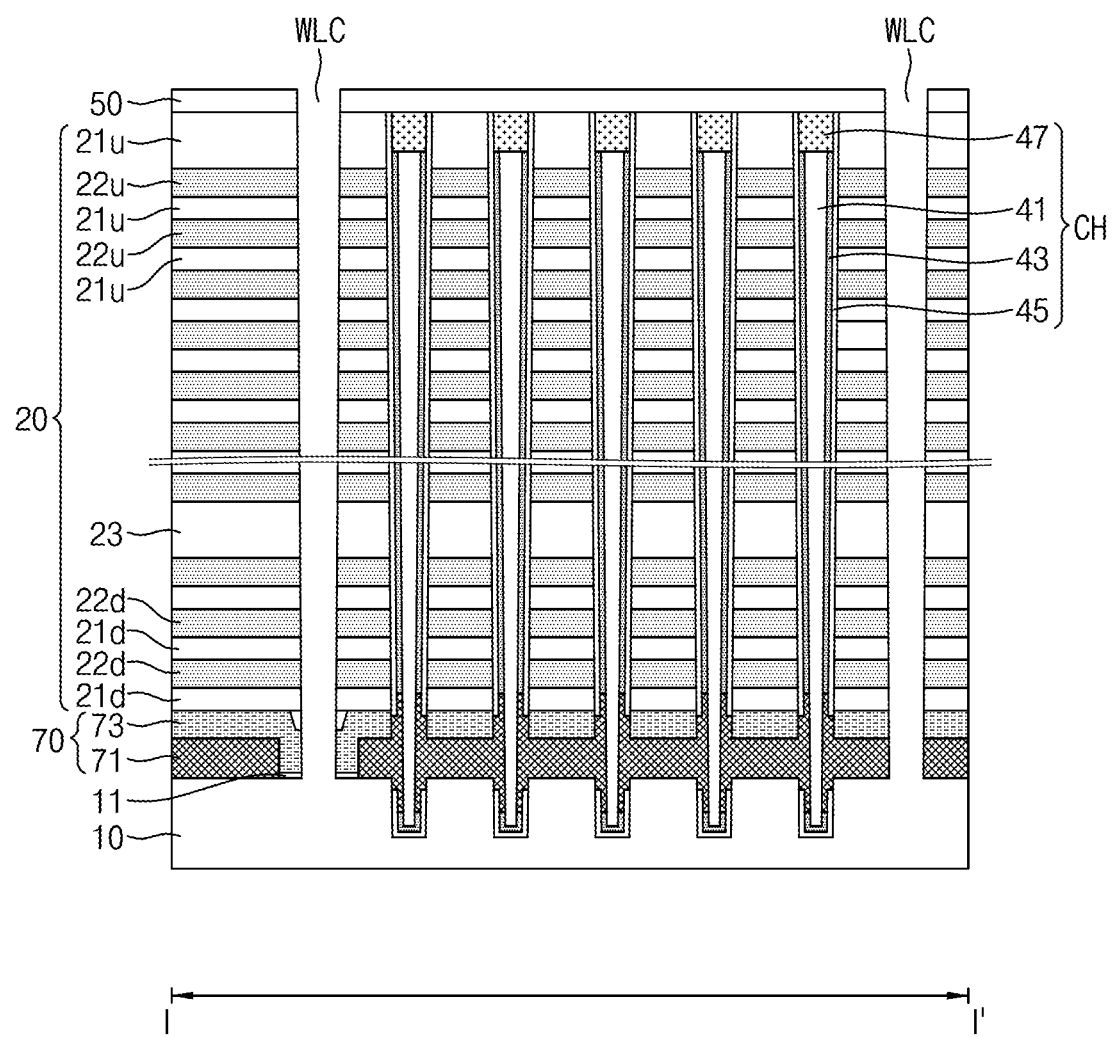

Referring to FIG. 23, the method may further include forming a source conductive pattern through partial removal of the conductive layer 60, and forming a word line cut WLC extending through the stack structure 20. As a portion of the conductive layer 60 formed in the vertical through hole area VT is removed, a lower source conductive pattern 71 may be formed. The lower source conductive pattern 71 may be formed in the horizontal through hole area HT, the undercut area UC, and the extended undercut area UE.

During an isotropic etching process for the conductive layer 60, the source conductive layer 15 may also be partially etched. As the source conductive layer 15 is etched, an upper source conductive pattern 73 may be formed. As a portion of the conductive layer 60 and a portion of the source conductive layer 15 are etched, the word line cut WLC may be formed. The word line cut WLC may expose an inner side surface of the stack structure 20 therethrough.

The isotropic etching process for partial removal of the conductive layer 60 may be performed using etching conditions having etch selectivity with respect to the stack structure 20. For example, the isotropic etching process for etching the conductive layer 60 may be a wet etching process using a mixture solution of deionized water (SC-1: Standard Clean-1) or aqueous ammonia ($NH_4OH$).

Figure 24:
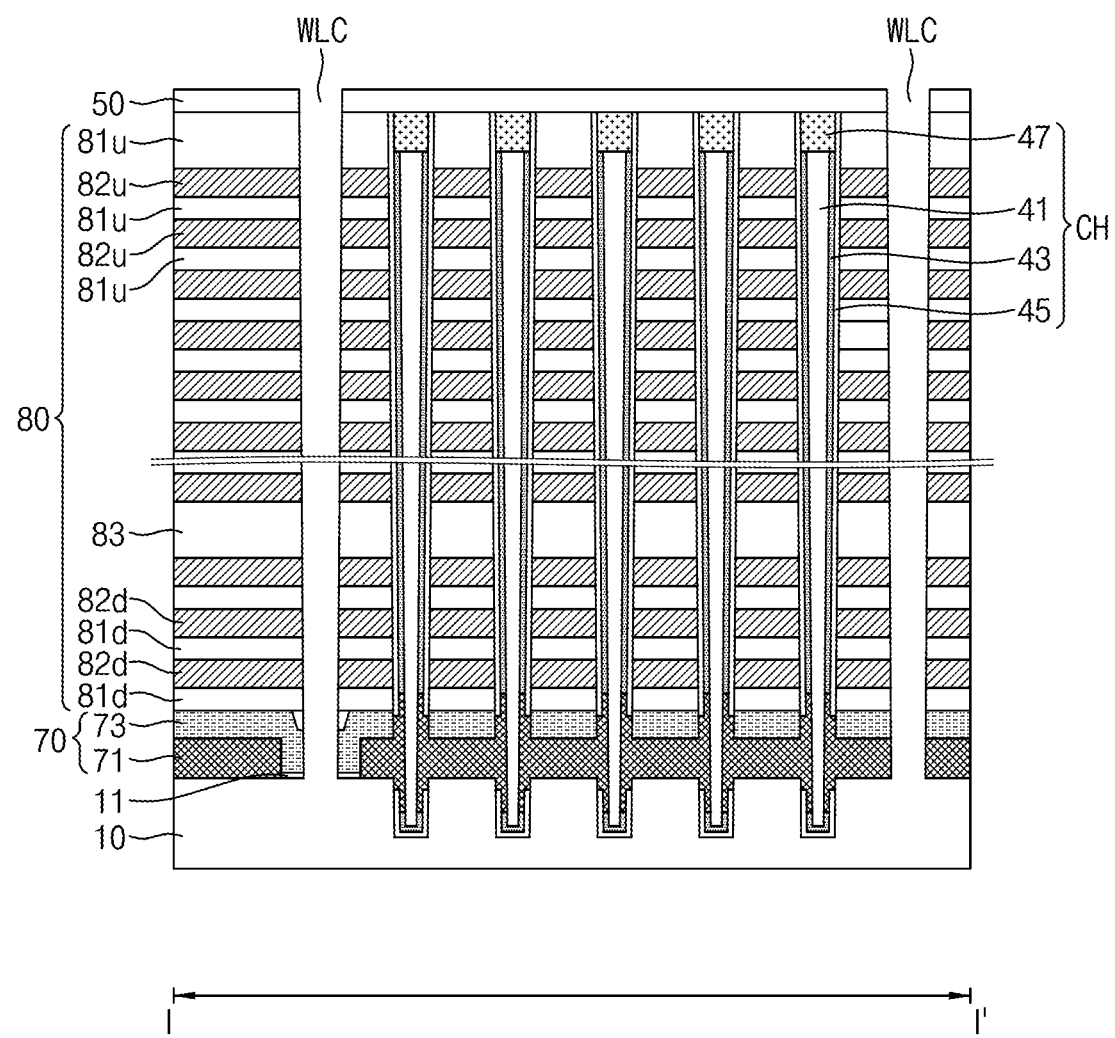

Referring to FIG. 24, the method may further include forming gate electrodes 82. Formation of the gate electrodes 82 may include forming a gate region through removal of the sacrificial layers 22d and 22u of the stack structure 20. Removal of the sacrificial layers 22d and 22u may include performing an etching process having etch selectivity with respect to the insulating layer 21d, 21u and 23, the data storage pattern 41, the lower source conductive pattern 71, the upper source conductive pattern 73, and the substrate 10. The gate region may expose upper and lower surfaces of the insulating layers 21d, 21u and 23 therethrough, and may expose a portion of the side surface of the data storage pattern 41 therethrough.

Thereafter, the gate electrodes 82 may be formed in and may at least partially fill the gate region. Formation of the gate electrodes 82 may include forming a gate electrode layer in so as to at least partially fill the word line cut WLC and the gate region, and then removing a portion of the gate electrode layer in the word line cut WLD, thereby forming the gate electrodes 82 in the gate region.

Again referring to FIG. 2, the method may further include forming a common source structure CSS in the word line cut WLC. The method may further include forming a lower contact 90 extending through the capping layer 50, and forming an interlayer insulating layer 93, an upper contact 95, and bit lines BL on the capping layer 50. In addition, the method may further include performing a thermal treatment process for diffusing the N-type impurity from the lower source conductive pattern 71 around the lowermost gate electrode 82d-1 through thermal treatment.

In accordance with embodiments of the inventive concept, it may be possible to provide an appropriate physical distance between a gate-induced drain leakage (GIDL) erase transistor and a source conductive pattern, and to provide an impurity for diffusion control at an interface between a channel pattern and the source conductive pattern. Accordingly, it may be possible to appropriately secure holes for an erase operation and, as such, reliability of a GIDL erase operation may be enhanced.

While the embodiments of the inventive concept have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. A semiconductor device comprising:
a gate structure on a substrate, the gate structure including insulating layers and gate electrodes, which are alternately stacked;
a channel structure extending through the gate structure; and
a source conductive pattern between the substrate and the gate structure,
wherein the source conductive pattern includes a lower source conductive pattern and an upper source conductive pattern on the lower source conductive pattern,
wherein the channel structure includes
an insulating pattern extending through the source conductive pattern,
a data storage pattern, and
a channel pattern between the insulating pattern and the data storage pattern, and
wherein a lower surface of the channel pattern is at a level higher than an upper surface of the upper source conductive pattern, but lower than a lower surface of a lowermost one of the gate electrodes in a cross-sectional view of the semiconductor device with the substrate providing a base reference level.

2. The semiconductor device of claim 1, wherein the lower surface of the channel pattern is at a higher level than a lower surface of the data storage pattern in the cross-sectional view of the semiconductor device with the substrate providing the base reference level.

3. The semiconductor device of claim 2, wherein the lower surface of the data storage pattern is at a lower level than the upper surface of the upper source conductive pattern in the cross-sectional view of the semiconductor device with the substrate providing the base reference level.

4. The semiconductor device of claim 2, wherein the lower surface of the data storage pattern is at a higher level than the upper surface of the upper source conductive pattern in the cross-sectional view of the semiconductor device with the substrate providing the base reference level.

5. The semiconductor device of claim 1, wherein the lower surface of the channel pattern is at substantially a same level as the lower surface of the data storage pattern in the cross-sectional view of the semiconductor device.

6. The semiconductor device of claim 1, wherein:
a portion of a lower surface of the data storage pattern is at a higher level than the upper surface of the upper source conductive pattern in the cross-sectional view of the semiconductor device with the substrate providing the base reference level; and
another portion of the lower surface of the data storage pattern is at a lower level than the upper surface of the upper source conductive pattern in the cross-sectional view of the semiconductor device with the substrate providing the base reference level.

7. The semiconductor device of claim 1, wherein an upmost portion of a lower surface of the data storage pattern is at a lower level than the lower surface of the channel pattern in the cross-sectional view of the semiconductor device with the substrate providing the base reference level.

8. The semiconductor device of claim 1, wherein an uppermost portion of a lower surface of the data storage pattern is at a level higher than the lower surface of the channel pattern, but lower than the lower surface of the lowermost one of the gate electrodes in the cross-sectional view of the semiconductor device with the substrate providing the base reference level.

9. The semiconductor device of claim 1, wherein:
the data storage pattern includes a blocking layer, a charge storage layer and a tunnel insulating layer, which are sequentially stacked on an outer side surface of the channel pattern; and
lower surfaces of the blocking layer, the charge storage layer and the tunnel insulating layer are at different levels, respectively in the cross-sectional view of the semiconductor device.

10. The semiconductor device of claim 9, wherein a portion of the lower source conductive pattern is between the insulating pattern and the blocking layer while physically contacting the lower surface of the channel pattern.

11. The semiconductor device according to claim 1, wherein the lower surface of the channel pattern includes C or N.

12. A semiconductor device comprising:
a gate structure on a substrate, the gate structure including insulating layers and gate electrodes, which are alternately stacked;
a channel structure extending through the gate structure; and a source conductive pattern between the substrate and the gate structure,
wherein the source conductive pattern includes a lower source conductive pattern and an upper source conductive pattern on the lower source conductive pattern,
wherein the channel structure includes
an insulating pattern extending through the source conductive pattern,
a data storage pattern, and
a channel pattern between the insulating pattern and the data storage pattern,
wherein a portion of the lower source conductive pattern is between the insulating pattern and the data storage pattern while physically contacting a lower surface of the channel pattern, and
wherein the lower surface of the channel pattern is at a higher level than a lower surface of the data storage pattern in a cross-sectional view of the semiconductor device with the substrate providing a base reference level.

13. The semiconductor device of claim 12, wherein the lower surface of the channel pattern is nearer to a lower surface of a lowermost one of the gate electrodes than to an upper surface of the upper source conductive pattern.

14. The semiconductor device of claim 12, wherein the lower surface of the data storage pattern is at a lower level than an upper surface of the upper source conductive pattern in the cross-sectional view of the semiconductor device with the substrate providing the base reference level.

15. The semiconductor device of claim 12, wherein the lower surface of the data storage pattern is at a level substantially equal to or higher than an upper surface of the upper source conductive pattern in the cross-sectional view of the semiconductor device with the substrate providing the base reference level.

16. A semiconductor device comprising:
a gate structure on a substrate, the gate structure including insulating layers and gate electrodes, which are alternately stacked;
a lower source conductive pattern between the substrate and the gate structure;
an upper source conductive pattern between the lower source conductive pattern and the gate structure;
a channel structure extending through the gate structure;
a common source structure extending through the channel structure;
a contact on the channel structure; and
a bit line on the contact,
wherein the channel structure includes
an insulating pattern extending through the upper source conductive pattern and the lower source conductive pattern,
a data storage pattern, and
a channel pattern between the insulating pattern and the data storage pattern,
wherein the data storage pattern includes a tunnel insulating layer, a charge storage layer and a blocking layer, which are sequentially stacked on the channel pattern,
wherein the lower source conductive pattern includes
a horizontal extension on an upper surface of the substrate,
a vertical extension extending between the insulating pattern and the upper source conductive pattern, and
a protrusion protruding from an upper surface of the vertical extension, and wherein the protrusion includes a first protrusion between the insulating pattern and the tunnel insulating layer while physically contacting a lower surface of the channel pattern.

17. The semiconductor device of claim 16, wherein the upper surface of the vertical extension is at a level higher than an upper surface of the upper source conductive pattern, but lower than a lower surface of a lowermost one of the gate electrodes in a cross-sectional view of the semiconductor device with the substrate providing a base reference level.

18. The semiconductor device of claim 16, wherein:
an upper surface of the first protrusion is at a level higher than an upper surface of the upper source conductive pattern, but lower than a lower surface of a lowermost one of the gate electrodes in a cross-sectional view of the semiconductor device with the substrate providing a base reference level; and
the upper surface of the vertical extension is at a lower level than the upper source conductive pattern in the cross-sectional view of the semiconductor device with the substrate providing the base reference level.

19. The semiconductor device of claim 16, wherein the protrusion further includes a second protrusion extending between the tunnel insulating layer and a lowermost one of the insulating layers.

20. The semiconductor device of claim 19, wherein the second protrusion is between the charge storage layer and the lowermost one of the insulating layers while physically contacting a lower surface of the blocking layer.

* * * * *